US011545497B2

(12) United States Patent
Chanemougame et al.

(10) Patent No.: US 11,545,497 B2
(45) Date of Patent: Jan. 3, 2023

(54) CFET SRAM BIT CELL WITH THREE STACKED DEVICE DECKS

(71) Applicant: Tokyo Electron Limited, Tokyo (JP)

(72) Inventors: Daniel Chanemougame, Albany, NY (US); Lars Liebmann, Albany, NY (US); Jeffrey Smith, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 81 days.

(21) Appl. No.: 17/139,303

(22) Filed: Dec. 31, 2020

(65) Prior Publication Data

US 2021/0202500 A1    Jul. 1, 2021

Related U.S. Application Data

(60) Provisional application No. 62/956,038, filed on Dec. 31, 2019, provisional application No. 63/085,563, filed on Sep. 30, 2020.

(51) Int. Cl.
*H01L 27/11* (2006.01)
*H01L 27/092* (2006.01)
(Continued)

(52) U.S. Cl.
CPC .... *H01L 27/1108* (2013.01); *H01L 21/02603* (2013.01); *H01L 21/823807* (2013.01);
(Continued)

(58) Field of Classification Search
CPC ........... H01L 27/1108; H01L 21/02603; H01L 21/823807; H01L 27/0922; H01L 29/0673;
(Continued)

(56) References Cited

U.S. PATENT DOCUMENTS 8,084,308 B2   12/2011   Chang et al.
8,466,451 B2    6/2013   Chang et al.
(Continued)

OTHER PUBLICATIONS

International Search Report and Written Opinion dated Apr. 27, 2021 in PCT/US/2020/067653, citing documents AA through AE therein, 10pages.

*Primary Examiner* — Tong-Ho Kim
(74) *Attorney, Agent, or Firm* — Oblon, McClelland, Maier & Neustadt, L.L.P.

(57) ABSTRACT

A static random access memory (SRAM) structure is provided. The structure includes a plurality of SRAM bit cells on a substrate. Each SRAM bit cell includes at least six transistors including at least two NMOS transistors and at least two PMOS transistors. Each of the six transistors is being lateral gate-all-around transistors in that gates wraps all around a cross section of channels of the at least six transistors. The at least six transistors positioned in three decks in which a third deck is positioned vertically above a second deck, and the second deck is positioned vertically above a first deck relative to a working surface of the substrate. A first inverter is formed using a first transistor positioned in the first deck and a second transistor positioned in the second deck. A second inverter is formed using a third transistor positioned in the first deck and a fourth transistor positioned in the second deck. A pass gate is located in the third deck.

18 Claims, 26 Drawing Sheets

(51) Int. Cl.
*H01L 29/06* (2006.01)
*H01L 29/423* (2006.01)
*H01L 29/786* (2006.01)
*H01L 21/02* (2006.01)
*H01L 21/8238* (2006.01)
*H01L 29/66* (2006.01)

(52) U.S. Cl.
CPC ...... *H01L 27/0922* (2013.01); *H01L 29/0673* (2013.01); *H01L 29/42392* (2013.01); *H01L 29/66742* (2013.01); *H01L 29/78696* (2013.01)

(58) Field of Classification Search
CPC ......... H01L 29/42392; H01L 29/66742; H01L 29/78696; H01L 29/0653; H01L 27/0207; H01L 27/0688; H01L 27/092; H01L 29/775; B82Y 10/00
USPC ........................................................ 257/351
See application file for complete search history.

(56) References Cited

U.S. PATENT DOCUMENTS

| | | | |
|---|---|---|---|
| 9,935,204 B2 | 4/2018 | Lee et al. | |
| 9,997,598 B2 | 6/2018 | Smith et al. | |
| 10,332,588 B2 | 6/2019 | Huynh et al. | |
| 10,374,099 B2 | 8/2019 | Lee et al. | |
| 10,453,850 B2 | 10/2019 | Smith et al. | |
| 10,529,830 B2 | 1/2020 | Tapily et al. | |
| 10,573,655 B2 | 2/2020 | Smith et al. | |
| 10,692,935 B2 | 6/2020 | Kwon et al. | |
| 10,741,676 B2 | 8/2020 | Lee et al. | |
| 2010/0295021 A1 | 11/2010 | Chang et al. | |
| 2012/0138888 A1* | 6/2012 | Chang | H01L 29/0673 257/E27.06 |
| 2017/0162583 A1 | 6/2017 | Lee et al. | |
| 2018/0026042 A1 | 1/2018 | Smith et al. | |
| 2018/0040695 A1* | 2/2018 | Smith | H01L 21/823878 |
| 2018/0040895 A1 | 2/2018 | Smith et al. | |
| 2018/0047832 A1 | 2/2018 | Tapily et al. | |
| 2018/0174642 A1* | 6/2018 | Huynh Bao | G11C 11/4085 |
| 2018/0190835 A1 | 7/2018 | Lee et al. | |
| 2018/0240802 A1 | 8/2018 | Smith et al. | |
| 2019/0006424 A1* | 1/2019 | Kwon | H01L 51/055 |
| 2019/0319137 A1 | 10/2019 | Lee et al. | |
| 2019/0326301 A1 | 10/2019 | Smith et al. | |
| 2020/0098897 A1 | 3/2020 | Tapily et al. | |
| 2020/0357932 A1 | 11/2020 | Lee et al. | |

* cited by examiner

A-B

A

B

C

CFET SRAM BIT CELL WITH THREE STACKED DEVICE DECKS

INCORPORATION BY REFERENCE

This present disclosure claims the benefit of U.S. Provisional Application No. 62/956,038, filed Dec. 31, 2019 and U.S. Provisional Application No. 63/085,563, filed on Sep. 30, 2020, the entire content of each of which is incorporated herein by reference in its entirety.

FIELD OF THE INVENTION

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

As the semiconductor industry transitions to a new device architecture, from finFET to lateral gate-all-around nano-sheet (LGAA NS), there is a significant research focus on the complementary FET device architecture, or CFET. CFET comprises stacking an NMOS device on top of a PMOS device (or vice versa). This physical arrangement takes advantage of the vertical dimension to provide better power, performance and area (PPA) scaling. The CFET architecture considered herein is based on the LGAA NS device architecture, which is nano-sheet stacked on nano-sheet instead of finFET stacked on finFET. In conventional technology, that is, planar bulk and finFET, NMOS and PMOS are built and arranged side-by-side on the same plane of the Si wafer. CFET takes advantage of the vertical dimension to stack the NMOS on top of the PMOS (or vice versa). A vertical common gate between NMOS and PMOS replaces the horizontal gate running from N to P side to make the complementary functions of CMOS.

SUMMARY

The present disclosure relates to microelectronic devices including semiconductor devices, transistors, and integrated circuits, including methods of microfabrication.

A first aspect is a static random access memory (SRAM) structure. The SRAM structure can include a plurality of SRAM bit cells on a substrate, each SRAM bit cell including at least six transistors including at least two NMOS transistors and at least two PMOS transistors. Each of the at least six transistors can be lateral gate-all-around transistors in that gates wraps all around a cross section of channels of the at least six transistors. The at least six transistors positioned in three decks in which a third deck is positioned vertically above a second deck, and the second deck is positioned vertically above a first deck relative to a working surface of the substrate. A first inverter can be formed using a first transistor positioned in the first deck and a second transistor positioned in the second deck. A second inverter can be formed using a third transistor positioned in the first deck and a fourth transistor positioned in the second deck, and a pass gate can be located in the third deck.

In some embodiments, the third deck can be electrically isolated from the first deck and the second deck.

In some embodiments, the at least six transistors can be positioned in two vertical stacks in which each stack has at least three transistors positioned over each other.

In some embodiments, the SRAM structure can include separation pillars that provide lateral isolation between gates of devices on the first deck and the second deck.

In some embodiments, one or more of the at least six transistors can include two or more nano-channels.

In some embodiments, at least one transistor can include more channels compared to another transistor of a given stack of transistors.

In some embodiments, an output of the first inverter can connect to an input of the second inverter.

In some embodiments, an output of the second inverter can connect to an input of the first inverter.

In some embodiments, at least one NMOS transistor and at least one PMOS transistor can share a common vertical gate.

A second aspect is a static random access memory (SRAM) structure. The SRAM structure can include a plurality of SRAM bit cells on a substrate, each SRAM bit cell including at least six transistors including at least two NMOS transistors and at least two PMOS transistors. Each of the at least six transistors can be lateral gate-all-around transistors in that gates wraps all around a cross section of channels of the at least six transistors. The at least six transistors positioned in three decks in which a third deck is positioned vertically above a second deck, and the second deck is positioned vertically above a first deck relative to a working surface of the substrate. A first inverter can be formed using a first transistor positioned in the second deck and a second transistor positioned in the third deck. A second inverter can be formed using a third transistor positioned in the second deck and a fourth transistor positioned in the third deck. A pass gate can be located in the first deck.

A third aspect is a method for forming a static random access memory (SRAM) bit cell on a substrate. The method includes forming at least six transistors including at least two NMOS transistors and at least two PMOS transistors, each of the six transistors being lateral gate-all-around transistors in that gates wraps all around a cross section of channels of the at least six transistors, the at least six transistors positioned in three decks in which a third deck is positioned vertically above a second deck, and the second deck is positioned vertically above a first deck relative to a working surface of the substrate. The method includes forming a first inverter formed using a first transistor positioned in the second deck and a second transistor positioned in the third deck. The method includes forming a second inverter formed using a third transistor positioned in the second deck and a fourth transistor positioned in the third deck; and forming a pass gate located in the first deck.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
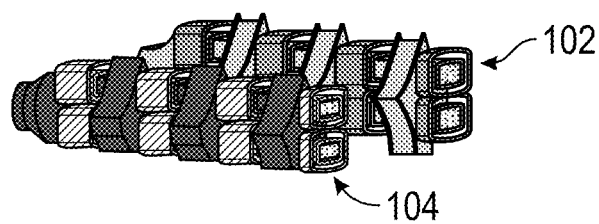
FIGS. 1A-1D show an example structure of PMOS and NMOS structure with common gates, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As the semiconductor industry transitions to a new device architecture, from finFET to lateral gate-all-around nanosheet (LGAA NS), there is a significant research focus on the complementary FET device architecture, or CFET.

Figure 1B:
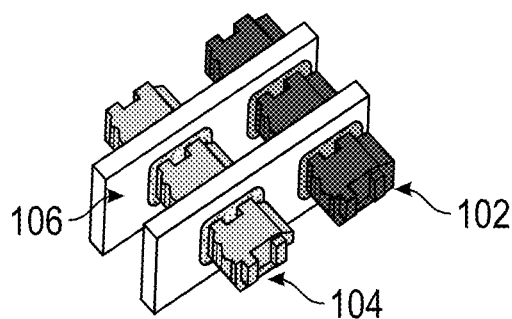
Figure 1C:
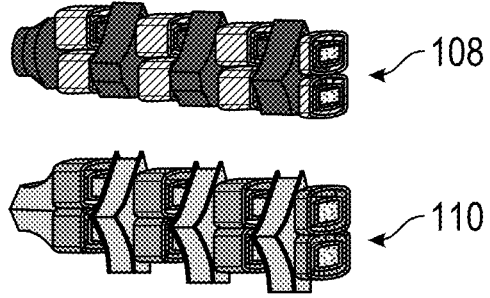
Figure 1D:
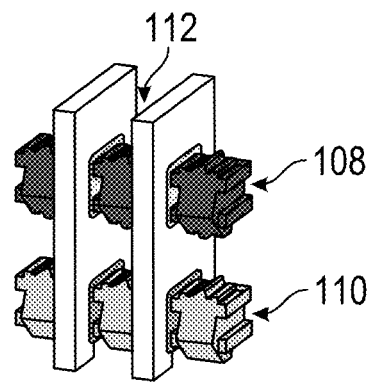

In FIGS. 1A-1D, CFET comprises stacking an NMOS device, e.g., device 108, on top of a PMOS device, e.g., device 110 (or vice versa). This physical arrangement takes advantage of the vertical dimension to provide better power, performance and area (PPA) scaling. The CFET architecture considered herein is based on the LGAA NS device architecture, which is nano-sheet stacked on nano-sheet instead of finFET stacked on finFET. In conventional technology, that is, planar bulk and finFET, NMOS, e.g., device 104, and PMOS, e.g., device 102, are built and arranged side-by-side on the same plane of the Si wafer as shown in FIGS. 1A and 1B. CFET takes advantage of the vertical dimension to stack the NMOS, e.g., device 108, on top of the PMOS, e.g., device 110, (or vice versa) as shown in FIGS. 1C and 1D. A vertical common gate 112 between NMOS and PMOS in FIG. 1D replaces the horizontal gate 106 running from N to P side to make the complementary functions of CMOS in FIG. 1B.

Any core device architecture, whether it is bulk planar or finFET, should enable two important families of CMOS circuits: logic standard cells and memory circuits such as SRAM. Techniques herein have a primary focus on embodiments of CFET to SRAM bit cells in particular.

SRAM memory is just as critical as logic standard cells in any chip design. Indeed, modern chips require increasingly more SRAM memory. For instance, it is not uncommon to see more than 50% of a total chip area used by on-chip memory. This highlights how important scaling SRAM memory is.

Besides the single transistor, the most fundamental unit structure of SRAM memory is the bit cell. The bit cell is the actual memory element. Typically hundreds of millions of bit cells are used together to form SRAM memory arrays.

Figure 2:
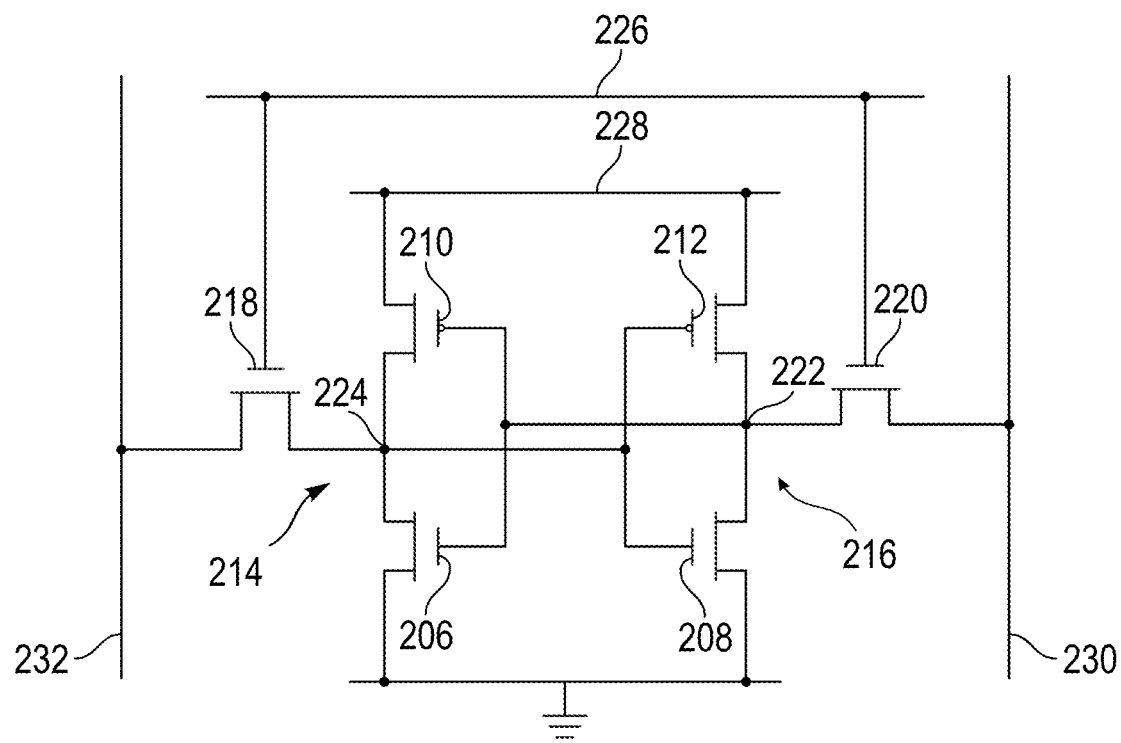
FIG. 2 shows a SRAM bit cell consisting of six transistors, in accordance with embodiments of the disclosure.

In FIG. 2, an SRAM bit cell is typically made of 6 transistors, e.g., 4 NMOS, 202, 204, 206, 208, and 2 PMOS, 210, 212 (6T bit cell). In some embodiments, the SRAM bit cell can be made of 6 transistors, e.g., 2 NMOS and 4 PMOS. The pass-gate device can be made with PMOS instead of NMOS. As is well known by one skilled in the art, these transistors are connected together to form two inverters, e.g., 214 and 216, (NMOS and PMOS sharing a common gate) latched together, that is, the output of one inverter is connected to the input of the other, and vice versa. Each output of each inverter is connected to another NMOS, called the pass-gate (PG), e.g., 218 and 220. The PMOS of each inverter is called the pull-up (PU), e.g., 210 and 212, and the NMOS of each inverter is called the pull-down (PD), e.g., 206 and 208. The outputs of each inverter are called internal nodes, Q 222 and !Q 224 (read "Q not" or "Q bar"). Description herein will refer to the inverter on the left as INV1, e.g., 214, and the inverter on the right as INV2, e.g., 216, leading to PU1/PD1/PG1, e.g., 210/206/218, and PU2/PD2/PG2, e.g., 212/208/220.

Figure 3A:
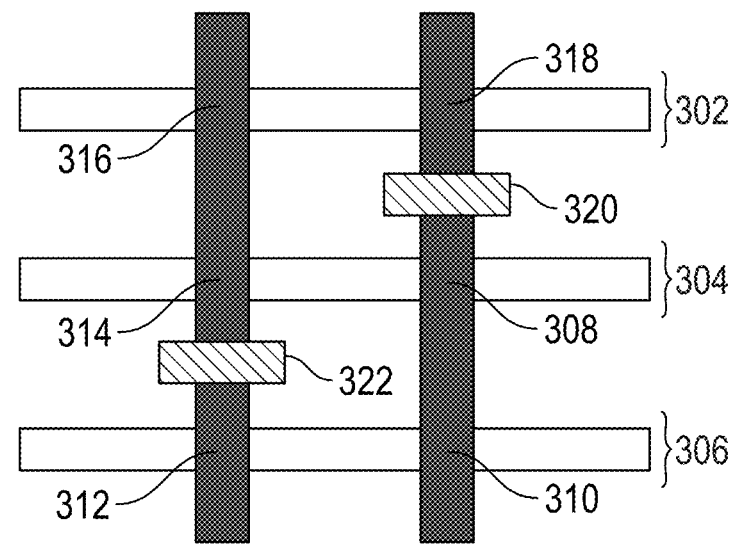
FIGS. 3A-3C show a layout view of bit cell designs, in accordance with exemplary embodiments of the disclosure.

FIG. 3A shows a simplified and idealized layout view of a bit cell design using finFET technology. The layout splits into three regions, e.g., NMOS region 302, PMOS region 304, and NMOS region 306. Each intersection in the simplified layout view of the bit cell design represents PU1 308, PD1 310, PG1 312, PU2 314, PD2 316, and PG2 318. Gate cuts are located at 320 and 322.

Figure 3B:
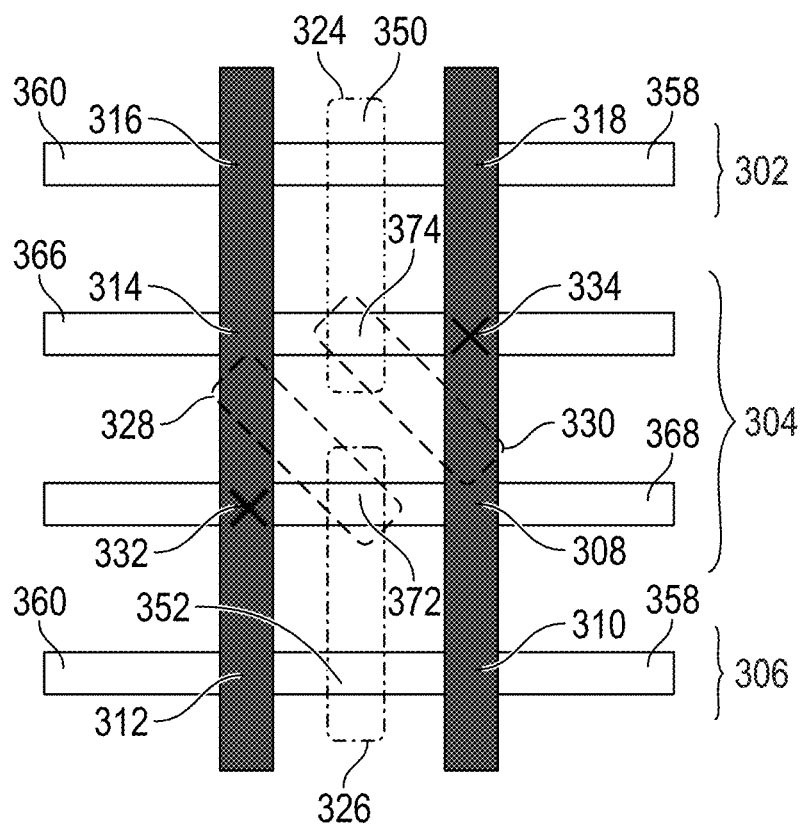
Figure 3C:
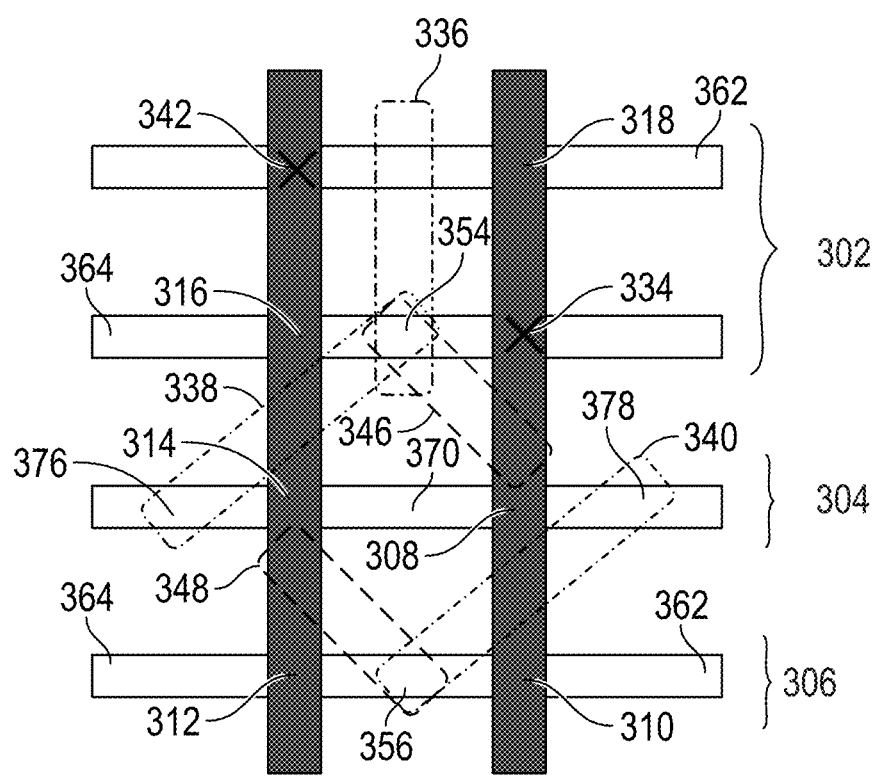

FIGS. 3B and 3C represent different, more realistic implementations of FIG. 3A layout. In FIGS. 3B and 3C, the vertical boxes and the vertical and right slanted boxes represent interconnects required to either connect the inverter output together and/or connect the pass-gate diffusion to it. The vertical boxes can be the boxes 324 and 326 in FIG. 3B. The vertical boxes can be the box 336 in FIG. 3C and the right slanted boxes can be the boxes 338 and 340 in FIG. 3C. The crosses, e.g., 332 and 334 in FIG. 3B and 342 and 344 in FIG. 3C, represent extra transistors that must be disabled or removed by process means. The left angle boxes, e.g., 328 and 330 in FIG. 3B and 346 and 348 in FIG. 3C, refer in particular to the cross-couple needed to connect the gate of INV1 to the output of INV2 in FIG. 3B and FIG. 3C and vice versa. There are many variants and options, some of which will be described subsequently. This illustrates some examples with conventional technologies. It should be noted that in FIG. 3B, the bit cell is represented with the fins running horizontally, in the typical conventions of logic standard cells. SRAM bit cells, however, are usually represented with a 90 degree rotation compared to FIG. 3C, that is, with fins running vertically. Thus, when looking at an SRAM array, it will be organized with rows and columns of bit cells. Bit cells in one horizontal row have a common WL (word line) while bit cells in a vertical column have common BL (bit line) and !BL, as shown in FIG. 2, e.g., 358 and 360 in FIG. 3B and 362 and 364 in FIG. 3C.

In FIGS. 3B and 3C, the bit cell internal nodes are Q and !Q (read "Q not" or "Q bar"), e.g., 350 and 352 in FIG. 3B and 354 and 356 in FIG. 3C. Ground voltage VSS is shown as 358 and 360 in FIG. 3B and 362 and 364 in FIG. 3C. Standby supply voltage VDD is shown as 366 and 368 in FIG. 3B and 370 in FIG. 3C. The outputs of each inverter are called Z1 and Z2, e.g., 372 and 374 in FIG. 3B, and 376 and 378 in FIG. 3C.

The basic bit cell shape, or topology, is typically a rectangle made with two lines of gates, defining the width of the cell. With two gates, to obtain six transistors, one would need a minimum of three fins, defining the height of the cell. With a tight fin pitch, that would provide the minimum cell height possible, therefore the densest bit cell area. However a three-fin design as shown in FIG. 3A is not possible as is well known for those skilled in the art.

As a brief description, in a three-fin design, separating the gates of PG1 and [PU2+PD2] and the gates of PG2 and [PU1+PD1] cannot be enabled by the process. There is simply not enough space. As shown in FIG. 3A, this separation is typically done in the process by printing a shape to cut the gate, and that requires space. Another process capability limiting the scaling of the height is the cross-couple connections, as indicated in FIGS. 3B and 3C by the left angle boxes. As seen in FIG. 2, the cross-couple is enabling the connection between the gate of INV1 to the output of INV2 and vice versa. As indicated in FIGS. 3B and 3C, this also requires space.

These reasons force the cell to use four fins instead of three as indicated by FIGS. 3B and 3C. So instead of creating just six transistors, there are now eight. Two extra transistors must be disabled or removed, as shown on FIG. 3B or 3C. With that basic bit cell topology established for conventional finFET technologies, scaling the cell height is scaling the fin pitch, and as is well known for those skilled in the art, the fin pitch scaling is close to an end.

Embodiments herein use an inherent symmetry to the cell, in particular, "folding" the cell along the horizontal axis in the middle of the cell, the cell area would be greatly reduced. Embodiments include a new CFET architecture that leverages CFET features to produce an extremely compact SRAM bit cell. The symmetric half of any 6-transistor bit cell designs contains two NMOS and one PMOS (or two PMOS and one NMOS). Embodiments herein use the stacked transistors of the CFET architecture to substantially reduce the size of the resulting bit cell. This new 3-deck CFET architecture contains three active devices: one NMOS device stacked over one NMOS device stacked over one PMOS device. The bottom NMOS device and PMOS device naturally share a common gate to form the inverter while the top NMOS forms the pass-gate. By combining two such CFETs, a complete and extremely compact bit cell is formed. Embodiments include a device having two stacks of transistors that are connected to each other, each transistor stack having three stacked devices, with the top third device electrically isolated. Separation pillars or another insulating structure is configured to provide lateral isolation between gates of the bottom two devices, which provides a unique structure when combined with the third top device. Embodiments include a cross-couple structure as well as formation methods.

Moreover, SRAM bit cells herein can be tuned for different drive currents all while keeping a same foot print. For example, more or less channels can be formed for a given transistor. By a more specific example, a given transistor may have two gate-all-around channels, while a transistor above has five GAA channels. Thus the three devices/transistors of each stack can use different numbers of active channels to tune the power and performance of the SRAM bit cell, thereby enabling many different structures.

Figure 4A:
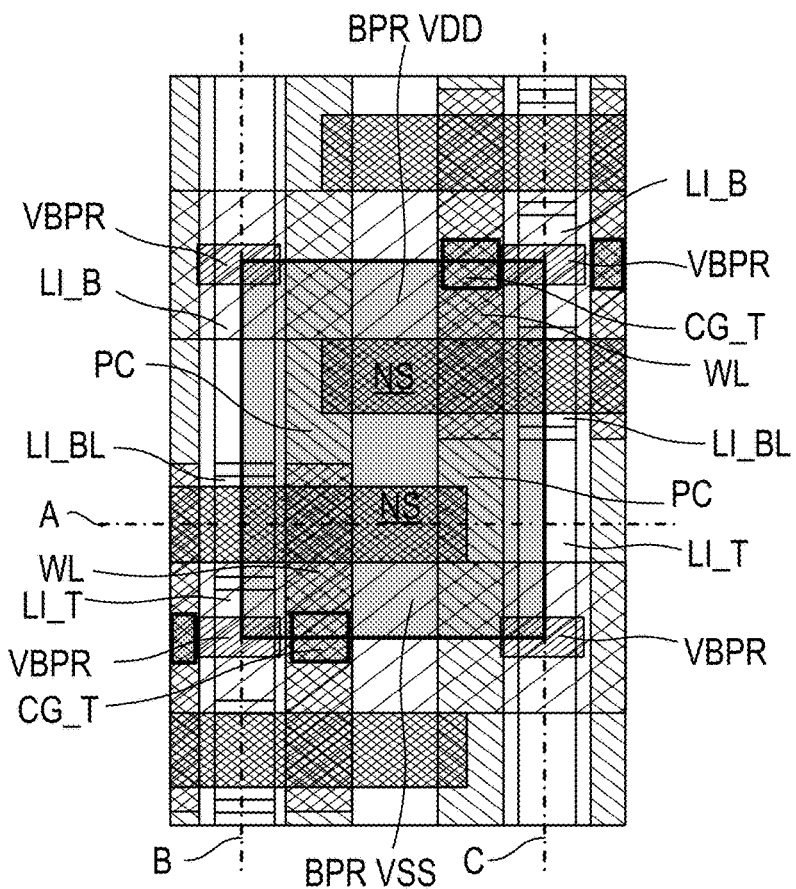
FIGS. 4A-4D show a CFET SRAM bit cell design and structure, in accordance with exemplary embodiments of the disclosure.
Figure 4B:
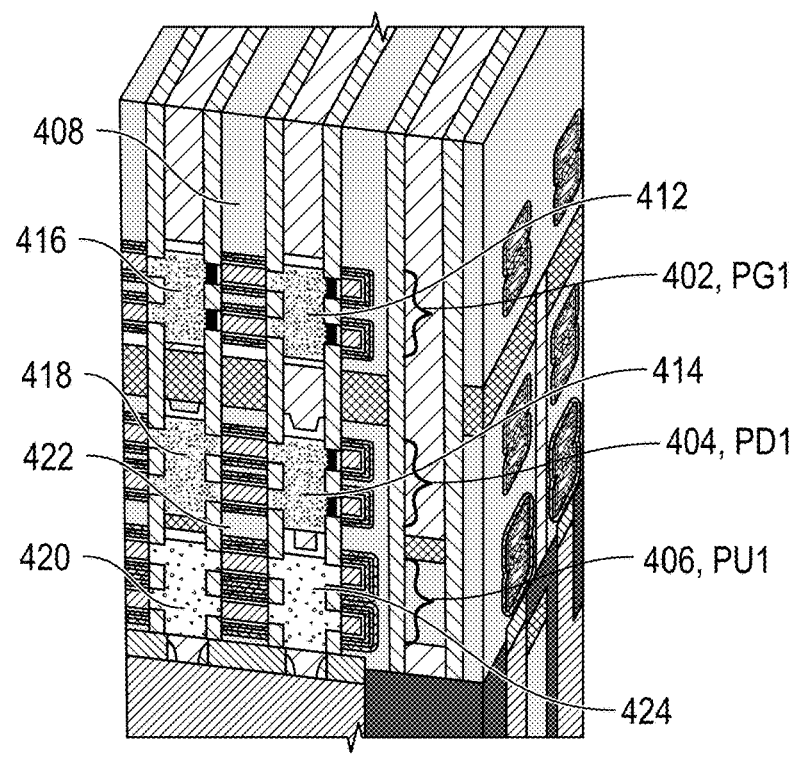

FIG. 4A-D show the structure of a CFET SRAM bit cell made with three stacked levels of transistors. FIG. 4A is a top down view, or layout representation of the bit cell, while the others are 3D perspective cross-sectional views of a 3D structure of that circuit, highlighting the three stacked levels of transistors. Starting from the bottom of the stack, there is PMOS device, then an NMOS device, then another NMOS device, thus a PNN stack as best seen in FIG. 4B. In particular, the bold black outline box on the layout FIG. 4A represents the unit bit cell boundaries. It should be noted that everything around that bit cell represents exactly identical bit cells of the array. Indeed, the array is typically built by duplicating multiple times the unit bit cell by left to right (or vice versa) symmetry and bottom to top (or vice versa) symmetry. Inside the bit cell boundaries, two nanosheet shapes can be seen representing the active layer or silicon channel, and two PC lines representing the gates. The intersection of two PC and two NS shapes typically creates a total of four devices, but with the three stacked devices of this CFET architecture, we have twelve devices.

Figure 4C:
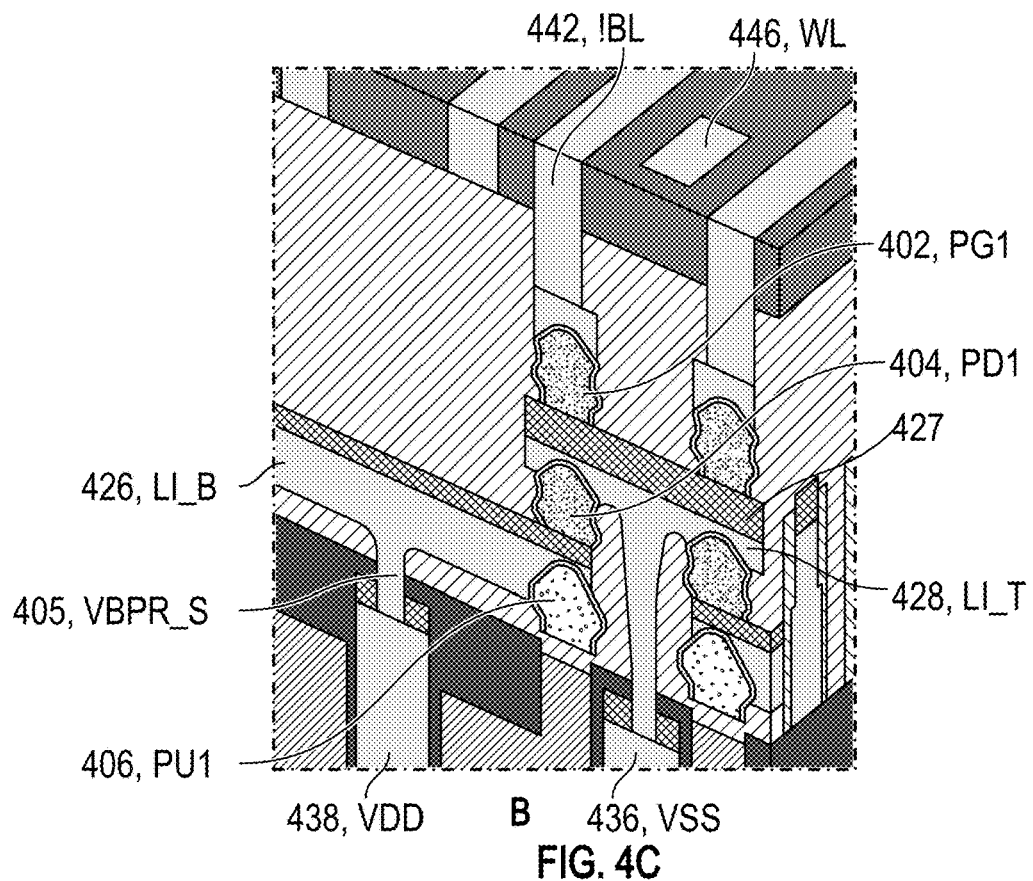
Figure 4D:
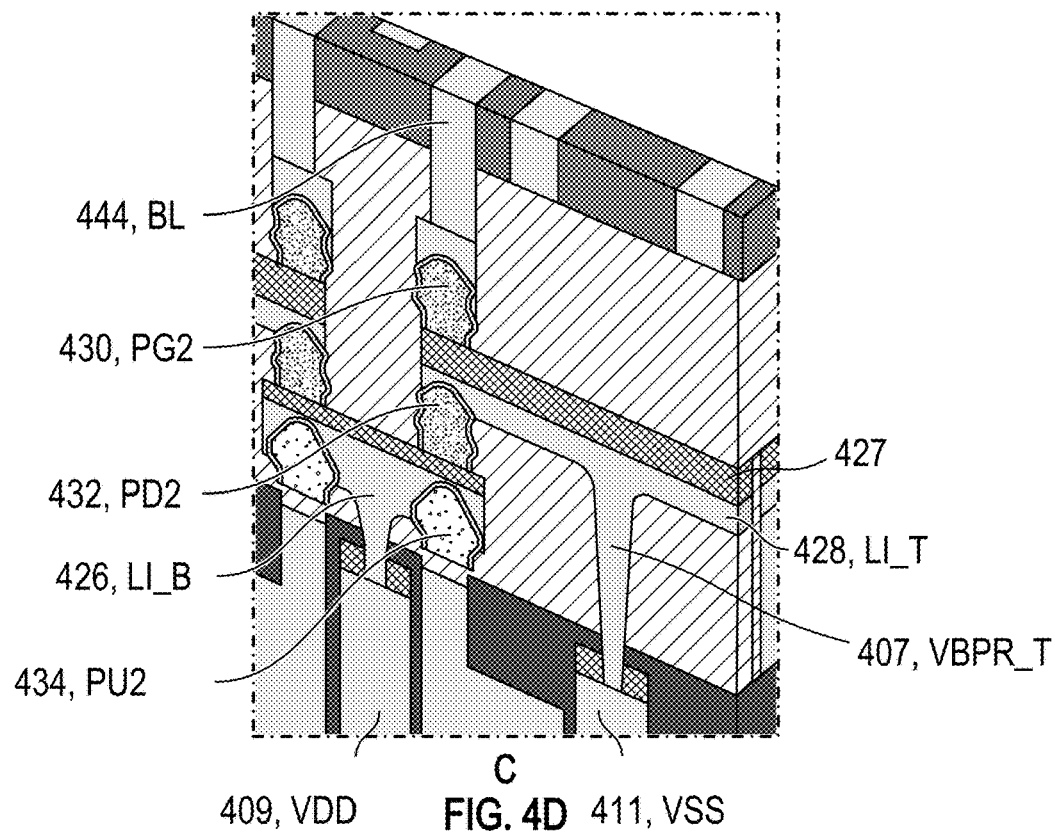

FIG. 4B shows cross-section A of FIG. 4A. The gates, e.g., 408 and 422, sources, e.g., 416, 418 and 420, and drains, e.g., 412, 414, and 424, of each stacked devices are illustrated. Note especially, the inverter formed by the bottom PMOS PU1, e.g., 406, and NMOS PD1, e.g., 404, can be identified by its common gate, e.g. 422. On top of it is the top NMOS, which is the pass-gate device or PG1, e.g., 402 having gate 408. The gate of PG1 and the inverter are separated. Cross-section B of FIG. 4A shown on FIG. 4C and cross-section C of FIG. 4A shown on FIG. 4D illustrate how the source and drain terminals of each stacked device are connected through local interconnects (LI_B, e.g., 426, LI_T, e.g., 428) to the outside world, e.g., the top metal interconnect (M0) and the buried power rail (BPR). In particular, cross-section B in FIG. 4C represents the first pair of three devices: PG1, e.g., 402, and INV1 (PU1, e.g., 406, and PD1, e.g., 404), while cross-section C represents the second pair of three devices: PG2, e.g., 430, and INV2 (PU2, e.g., 434, and PD2, e.g., 432), which is essentially a mirrored image of INV1 in cross-section B obtained by flipping left to right and then bottom to top. In particular, it should be noted that LI_B, e.g., 426, and LI_T, e.g., 428, interconnects are capped by a selectively deposited dielectric layer 427.

As can be seen also in the layout view of FIG. 4A, the bit cell contains two buried power rails: one VSS rail, e.g., BPR VSS, and one VDD rail, e.g., BPR VDD, at the top and bottom boundaries of the cell. Cross-sections B and C also highlight this beneficial element. Word lines (WL) shown in FIG. 4C is 446. BL (bit line) shown in FIG. 4D is 444. !BL shown in FIG. 4C is 442. VBPR_S shown in FIG. 4C is 405 and VBPR_T shown in FIG. 4D is 407. VDD shown in FIG. 4D is 409 and VSS shown in FIG. 4D is 411.

Where conventional designs require a minimum of four active shapes, or four fins in the case of finFET, this 3-deck CFET design is formed with two active shapes, or the equivalent of two fins. Indeed, typically for SRAM designs, density is favored against drive strength, therefore narrow nanosheets with width between 5 to 30 nm can be used. A significant reduction of the bit cell height can therefore be obtained herein.

Figure 5A:
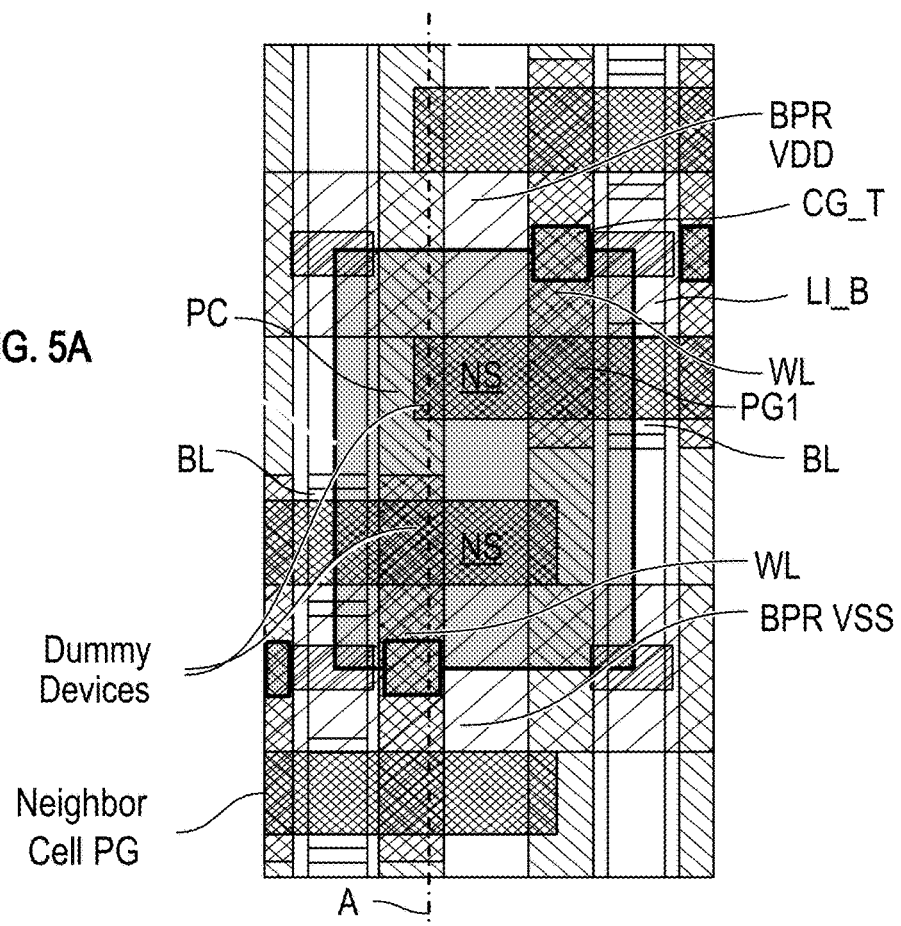
FIGS. 5A-5B show a CFET SRAM bit cell design and structure, in accordance with exemplary embodiments of the disclosure.
Figure 5B:
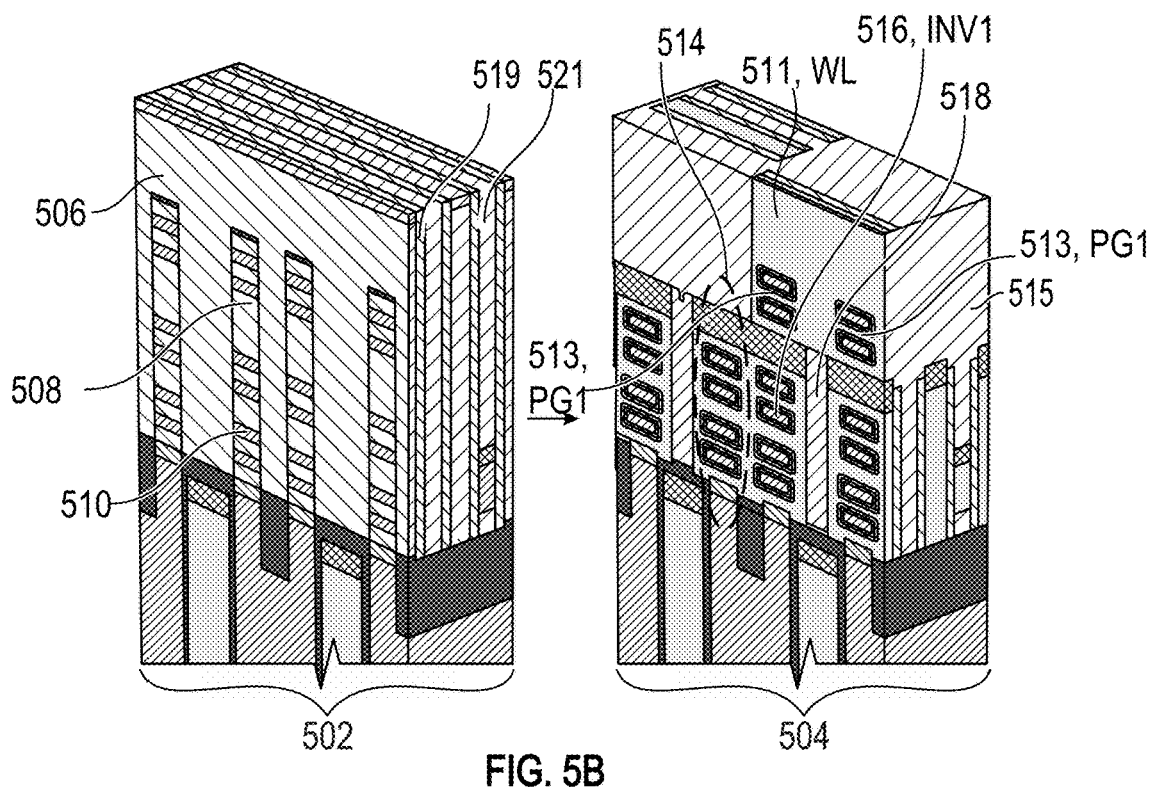

Referring now to FIGS. 5A-B, a CFET SRAM bit cell design and structure are illustrated having three stacked levels of transistors and highlighting gate structure herein. Vertical separation of the gates in a 3-deck CFET SRAM bit cell is fundamental. Lateral separation of the gates is also another fundamental element. As seen in FIGS. 3A-C, in conventional designs where all the devices are located in the same horizontal plane (the wafer plane), the devices are spread out enough that it is relatively straightforward to cut the gates where needed. As indicated, an SRAM memory is an array with multiple bit cells organized in rows and columns. Because gate lines are continuous in order for the process to form them at the relatively extreme dimensions required, one gate line runs across multiple bit cells located in the same row (gate orientation) of the array.

As a result, each inverter of each bit cell sharing the same gate line will have a common gate and this is not viable. Accordingly, there is a need to separate the gate of one cell's inverter from the adjacent cell's inverter.

On the other hand, the pass-gate devices located in the same row ultimately share the same gate, the WL, as seen in FIG. 4A. These two challenges are reconciled with techniques herein.

FIG. 5A shows the same layout of FIG. 4A but with cross-section A located inside and along the gate line.

The initial cross-section 502 shows the structure with a dummy gate 506. If no additional action is taken, when the replacement metal gate (RMG) module completes, it will form a single common gate across the row and across the different devices in the stack, disabling any desired functionality. The cross-section view 504 on the right of FIG. 5B shows a final desired outcome. As illustrated, the gate for each inverter 516 is separated from the adjacent cell's inverter by separation pillar 518. For the pass-gates located on top, we can see that neighboring pass-gates, one belonging to one cell and one to an adjacent cell, share a common gate. In the cross-sectional layout 502, 506 is the dummy gate material, 508 is a silicon germanium layer, 510 is a silicon layer, 519 is a gate spacer, and 521 is an oxide. In the cross-sectional layout 504, 511 is the word line (WL), 513 is PG1, and 515 is neighbor bit cell. 514 represents dummy devices within the ellipse.

It should be noted that the common WL is usually a metal line running above at M1, running across the multiple cells of the row, with gate contacts regularly dropping down to connect the pass-gates. Techniques herein take advantage of the symmetry inside the array to ease the patterning of those WL gate contacts as described below.

Figure 6:
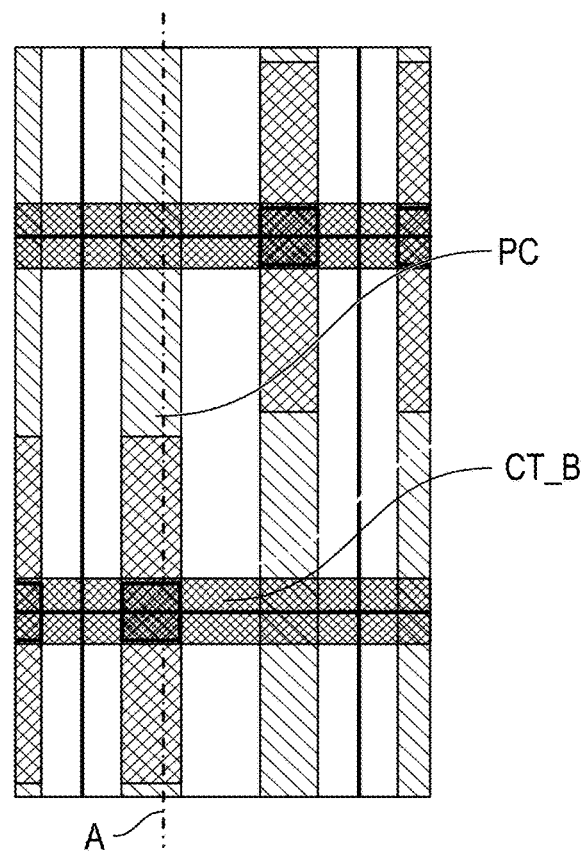
FIG. 6 shows a CFET SRAM bit cell design and structure, in accordance with exemplary embodiments of the disclosure.
Figure 6:
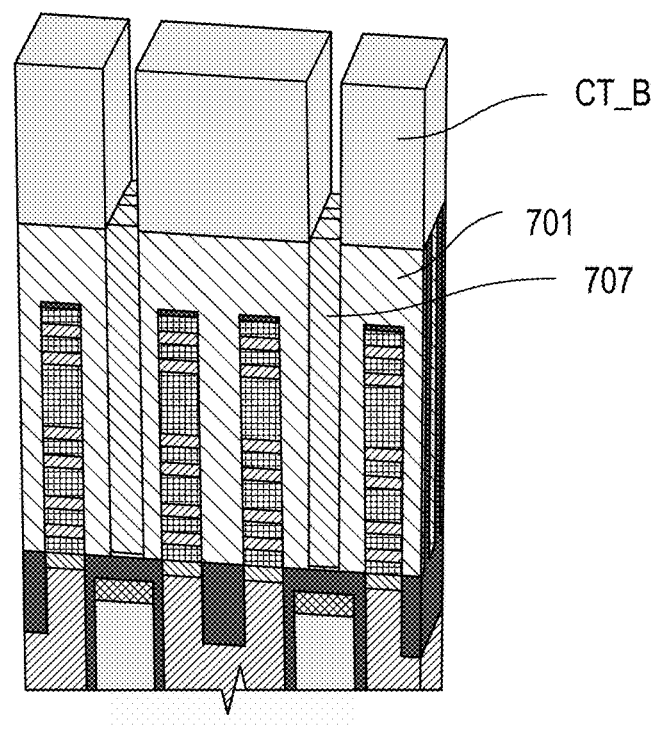

FIG. 6 shows a patterning layer used to obtain the desired state of gate separation between cells. FIG. 6 is the same layout as FIG. 5A but only the gate layer (PC) and CT_B layer are shown. CT_B enables achieving lateral separation described above. As can be seen in the layout and on cross-section A of FIG. 6, CT_B runs perpendicular to the gates and is at the cell boundaries shown by bold lines. CT_B is used to insert a dielectric separation in these locations only. As shown on cross-section A, the dummy gate material in these locations must be removed first to form a sidewall recess in the dummy gate material as discussed below.

Figure 7A:
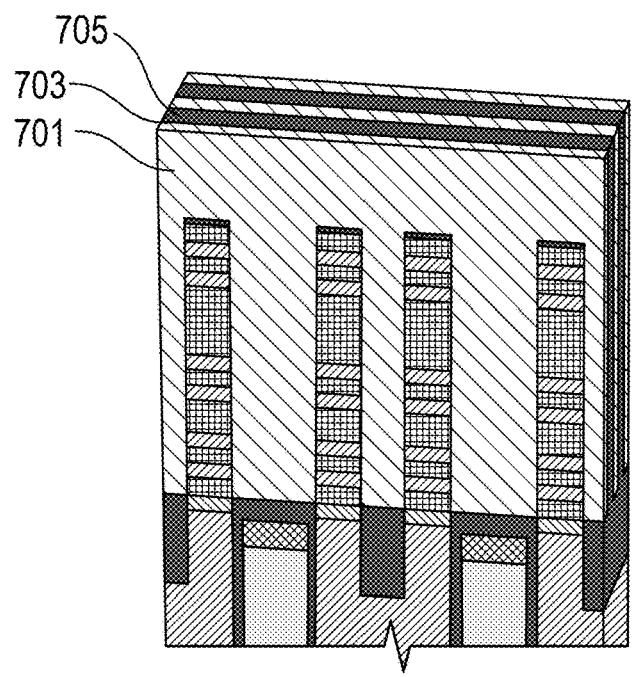
FIGS. 7A-7E show a formation of lateral gate separation, in accordance with exemplary embodiments of the disclosure.
Figure 7B:
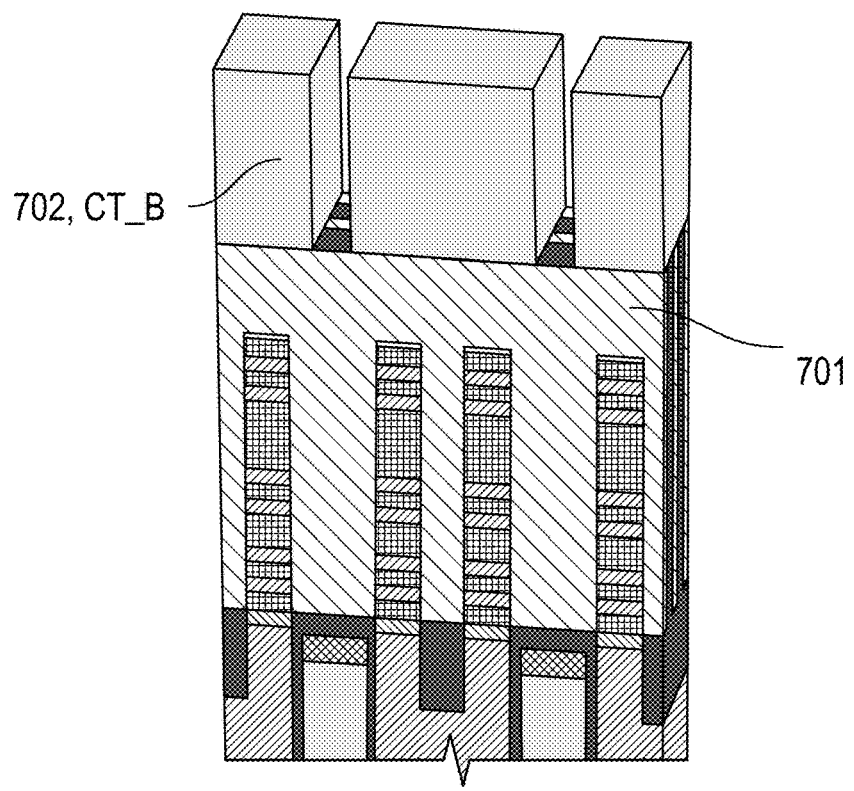
Figure 7C:
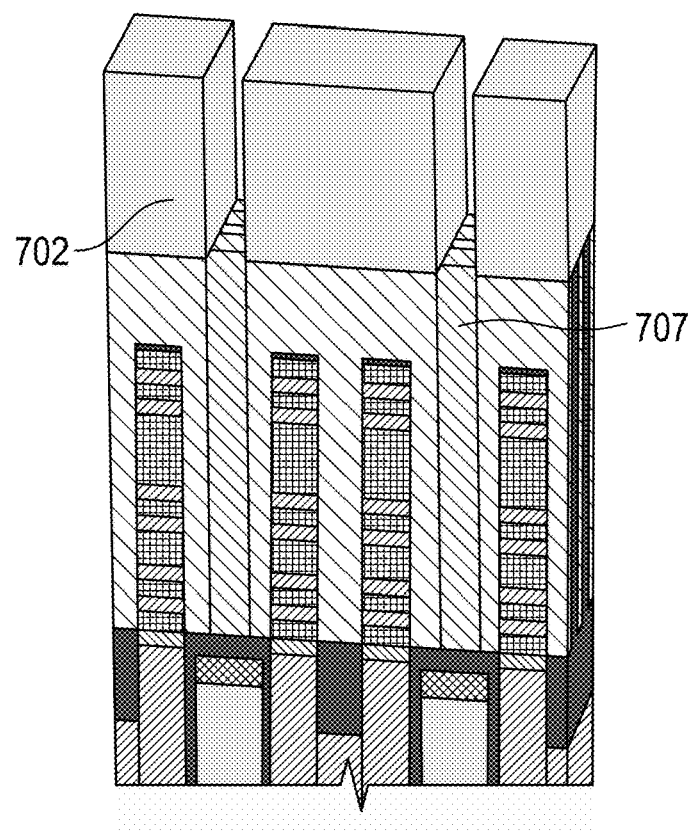

A more detailed flow is presented in FIGS. 7A-7E. FIG. 7A shows cross-section A through the dummy gate 701. Oxide 705 is provided behind the dummy gate 701, with gate spacer 703 separating the dummy gate 701 from the oxide 705. Gate spacer 703 is schematically shown as a simple boundary line. Once the surface is planarized by chemical mechanical planarization (CMP) to expose the dummy gate material (FIG. 7A), CT_B is patterned so the exposed dummy gate material can be removed by anisotropic and selective etch (FIG. 7B). As can be seen in FIG. 7C, removal of the dummy gate material forms a sidewall recess to expose the gate spacer material behind the dummy gate. The gate spacer material and the oxide in the source and drain area (behind the gate spacer) are exposed to the etch process but not etched due to the selectivity, making the etch self-aligned. The resist and patterning materials 702 are then stripped, and the created cavity can then be filled by a dielectric deposition (SiN) 704 in FIG. 7D. As is well known for one skilled in the art, these steps so far are conventional for a replacement metal gate (RMG) module.

Figure 7D:
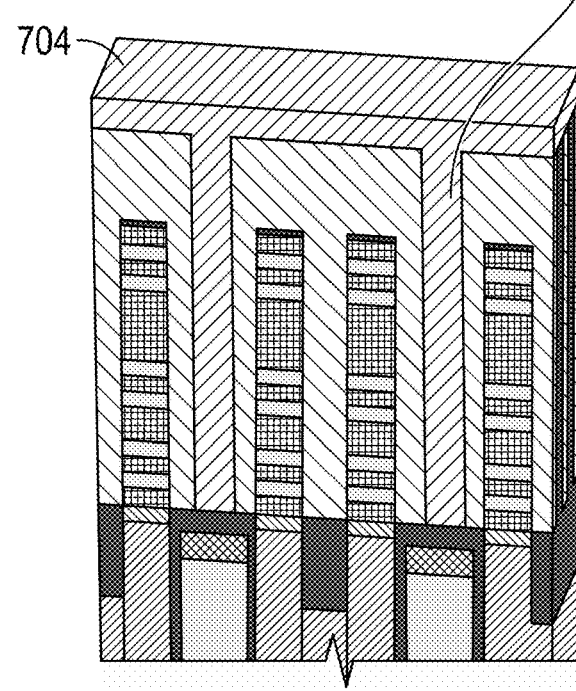
Figure 7E:
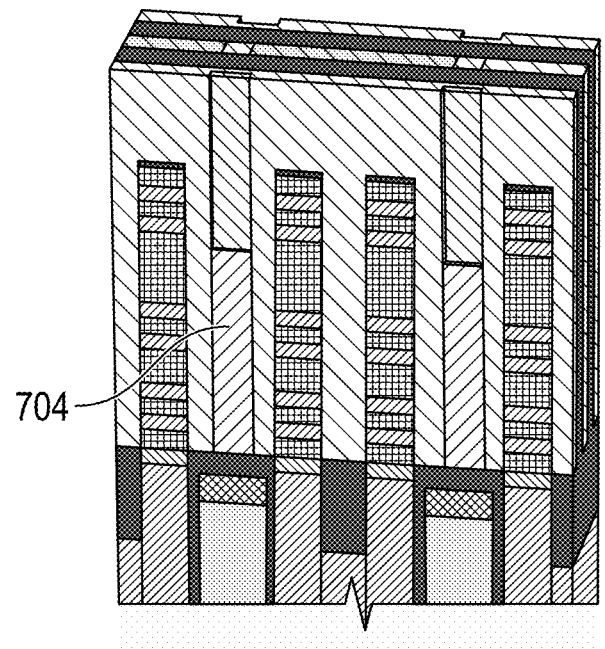

The next step helps enable techniques herein. After the dielectric has been deposited, the separation pillar 518 in FIG. 5B is formed, but has a full height that will also separate the gates of two adjacent pass-gates as shown in FIG. 7D. To solve this problem, the dielectric material of the separation pillar 518 is recessed in order to clear the top device, that is, the pass-gate device, as shown in FIG. 7E.

Figure 8A:
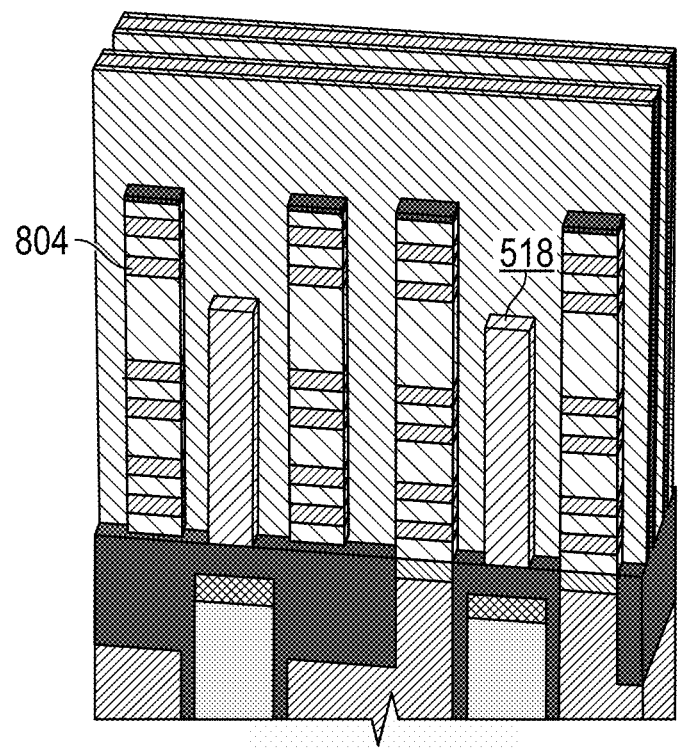
FIGS. 8A-8E show a formation of lateral gate separation, in accordance with exemplary embodiments of the disclosure.
Figure 8B:
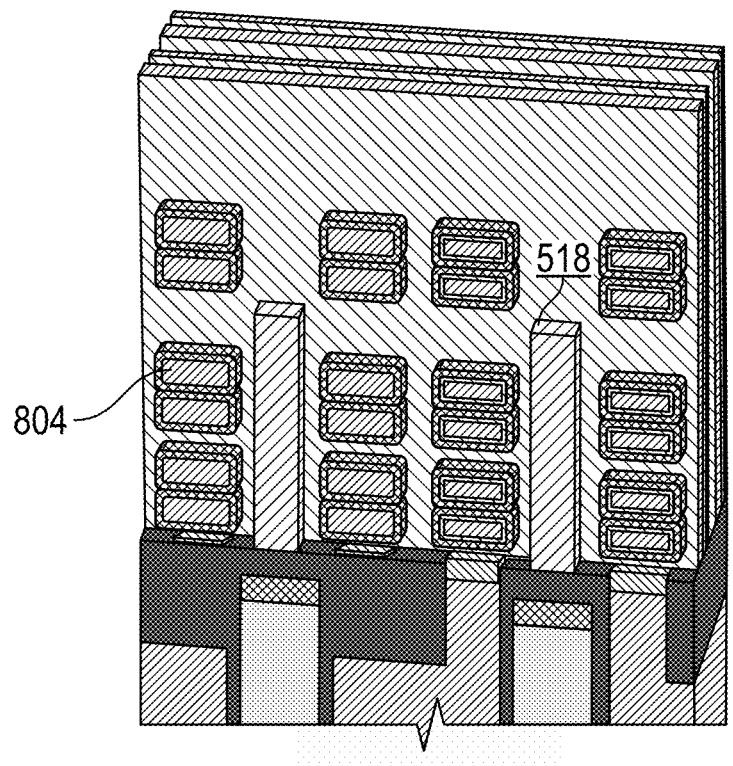

FIGS. 8A-8E continue the flow. Once the separation pillar 518 is defined, the RMG flow can be resumed. The dummy gate material is removed in FIG. 8A and the gate stack can be formed around the nanosheets in FIG. 8B. It should be noted that as can be seen in FIG. 8B, the interfacial layer/high-K dielectric layer (IL/HK) is formed selectively on the Si nanosheets 804 and similarly, the work function metals are also formed selectively on the HK.

Figure 8C:
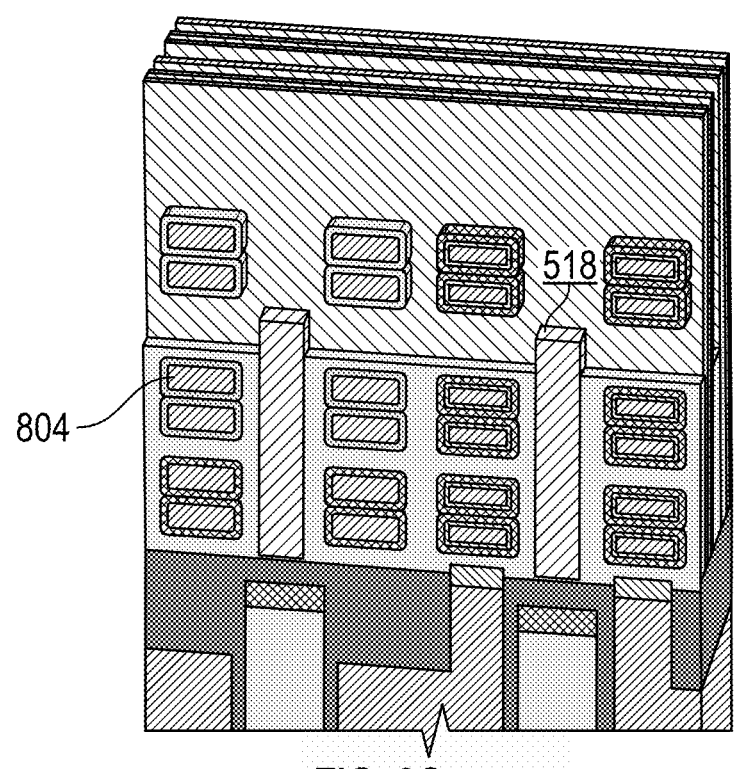

While this provides tighter integration and better tolerance for edge placement error, it should be noted that this lateral gate separation is compatible with non-selective depositions approaches. Once the gate stack is formed, the final metallization of the bottom inverter can follow as shown in FIG. 8C.

Figure 8D:
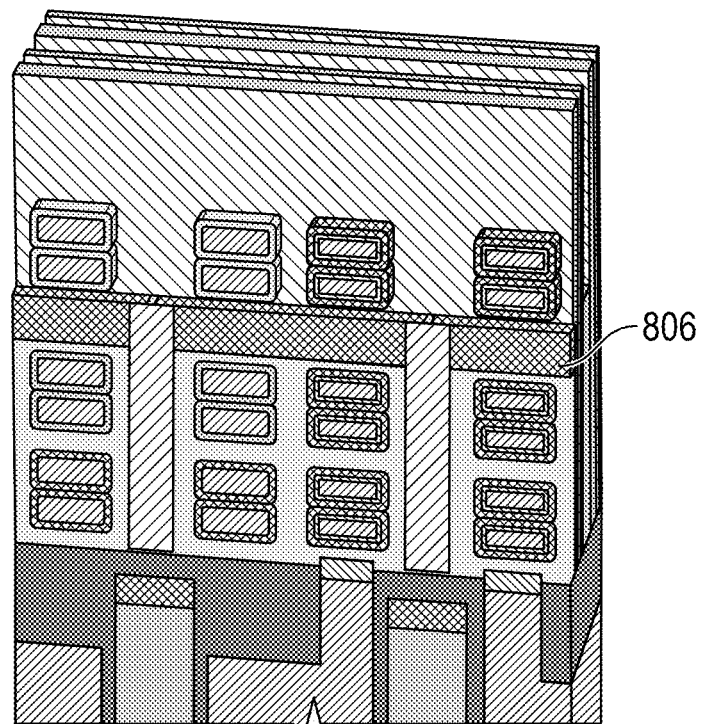
Figure 8E:
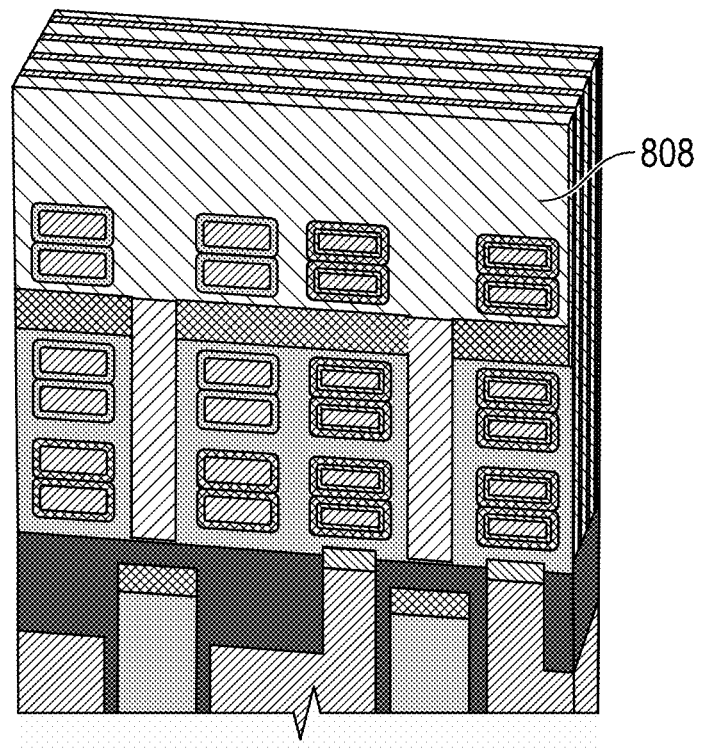

To provide vertical gate separation between bottom inverter and top pass-gate device, a dielectric film, e.g., 806, is selectively deposited on the final metal of the bottom inverter in FIG. 8D. In FIG. 8E, the final metallization, e.g., 808, of the top device is completed.

It should be noted that the control of the final pillar height is important but not critical. If the pillar is too short, then the bottom inverters' gates can short together during metallization of the gate stack in RMG, which is unwanted. If the pillar is too high, there are two possible situations. The pillar can be so high that it is covering the top device entirely or even higher, this is unwanted as it would separate the gates of these adjacent pass-gates. However, if the pillar is only partially covering the top device, that is, only slightly taller than ideal, then it is not a problem as the final metallization will short the gates of the 2 adjacent pass-gates, as desired.

Additionally, the amount of vertical separation between the top pass-gate and the bottom inverter will be the vertical margin for the process to achieve the final desired pillar height. As can be seen in cross-section A of FIG. 5B, this requirement for vertical separation is provided for during the initial active stack formation. Indeed, the SiGe layer separating the top pass-gate device from the inverter is thicker (10-40 nm) to act as a vertical separation and a process cushion.

The cross-couple is the next element of embodiments herein. As illustrated in FIGS. 3B-C, even on conventional designs, to provide the connections required in FIG. 2, specific interconnects are used, as shown by the boxes. The vertical, e.g., 324, 326, 336, and angle right boxes, e.g., 338, 340, are used to either connect the inverter output together and/or connect the pass-gate diffusion to it. The angle left boxes, e.g., 346 and 348, refer in particular to the cross-couple needed to connect the gate of INV1 to the output of INV2 and vice versa.

Given the 3D nature of this structure with three device levels stacked on top of each other, embodiments will now describe how the level of connectivity needed is provided. There are two distinct phases enabling the connectivity. First, access to the internal nodes of the bit cell must be provided in order to connect them to the gate of their respective inverter as shown in FIG. 2. As such, phase 1 includes partially clearing the top of the structure by removing the dummy pass-gate devices. Elements d1 and d2 are the dummy pass-gate devices 1 and 2 that are removed, as indicated in FIG. 9A.

Figure 9A:
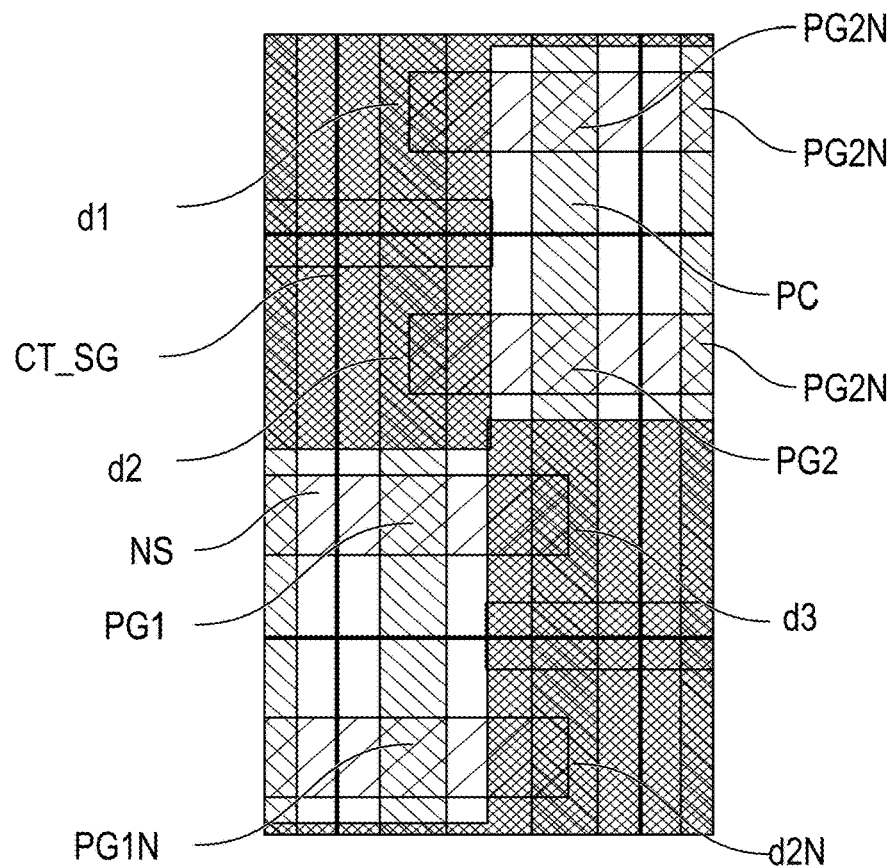
FIGS. 9A-9E show a formation of cross-couple, in accordance with exemplary embodiments of the disclosure.

Note that because of the symmetrical nature of a bit cell array, FIG. 9A shows neighboring cells around the bit cell of interest, and so d1N is the neighbor dummy device 1 and d2N is the neighbor ("N=neighbor") dummy device 2, as shown in FIG. 9A. Note that each device herein can include a single nano-sheet or multiple nano-sheets.

Figure 9B:
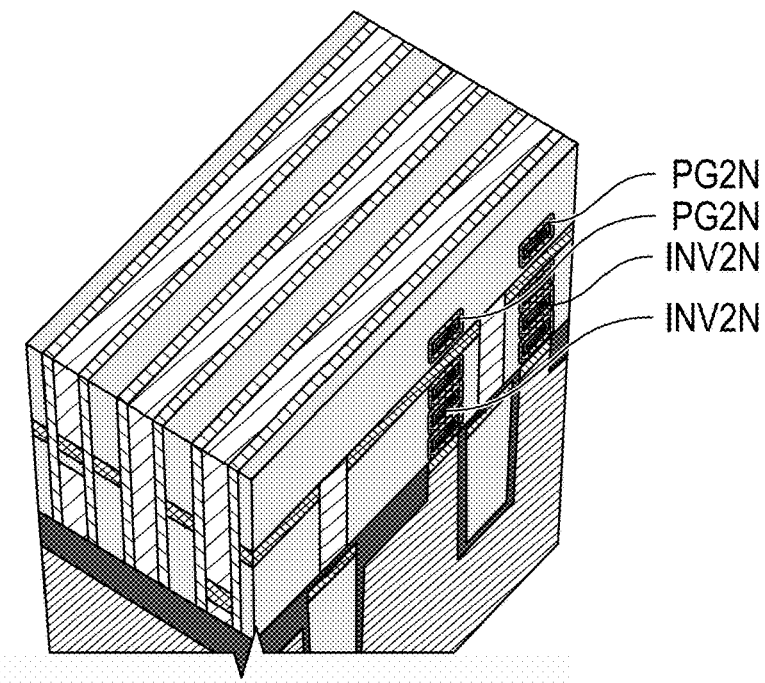
Figure 9C:
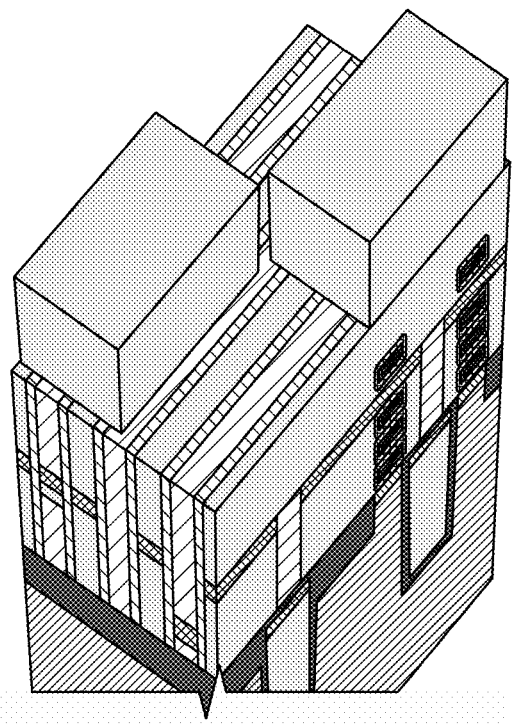

Once the top device receives its final metallization and the top of the structure is planarized by CMP (FIG. 9B), the layer CT_G is used to expose the area that must be cleared. As described in FIG. 9C, CT_SG patterning is using the negative tone of CT_SG defined in the layout as an example. As is known in the art, other combinations of resist and mask tone are possible. For example, step 2 printed patterns can be the result of printing CT_SG from the layout with a negative tone resist, e.g., the exposed areas of the resist cross-link and remain after development, while the non-exposed areas are dissolved and removed, exposing the areas of interest.

Figure 9D:
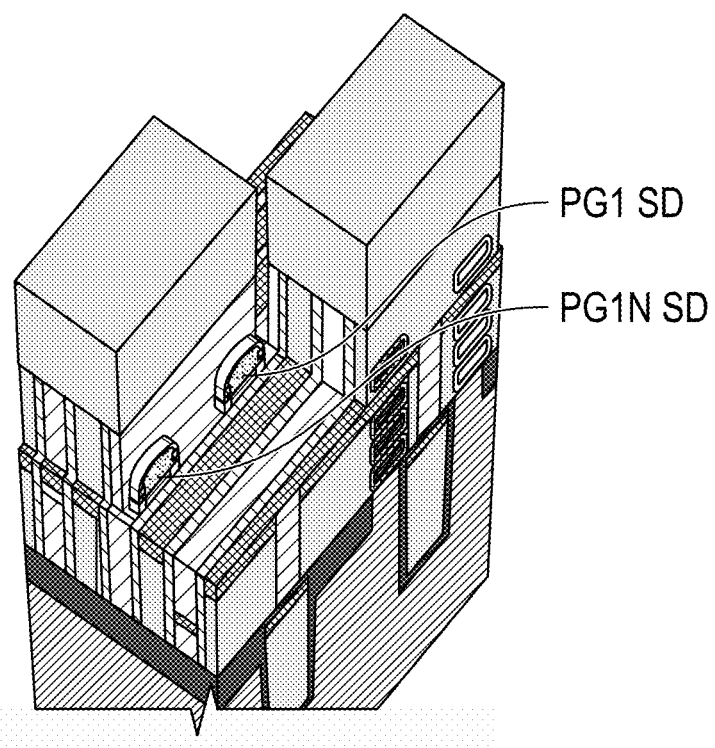

Now that the dummy pass-gates areas are exposed, they are etched away. As can be seen in FIG. 9D and as defined by CT_SG, a section is removed by an anisotropic etch. The etch step removes exposed materials of the gate stack such as metals, dielectrics and silicon. In particular, Ru, TiN, TiAl, HK and silicon are etched away. The silicon oxide SiO2 as well as the gate spacer material (SiN, SiON, SiCN, SiCON etc.) are etched as well. The dielectric layer providing the vertical separation between the gate of the device and the gate of the bottom inverter acts as an etch stop layer, as shown in FIG. 9D. This etch can have a combination of multiple etchants or be done in a desired sequence. In particular, the source and drain of the top pass-gate devices can be revealed (uncovered), the silicide that covers them can act as etch stop layer as well.

It should be noted though that it is possible that this exposed (uncovered) source and drain areas could be etched as well. This is not a problem as it would result in uncovering the side of these source & drain, and that works as well, as described more below.

Figure 9E:
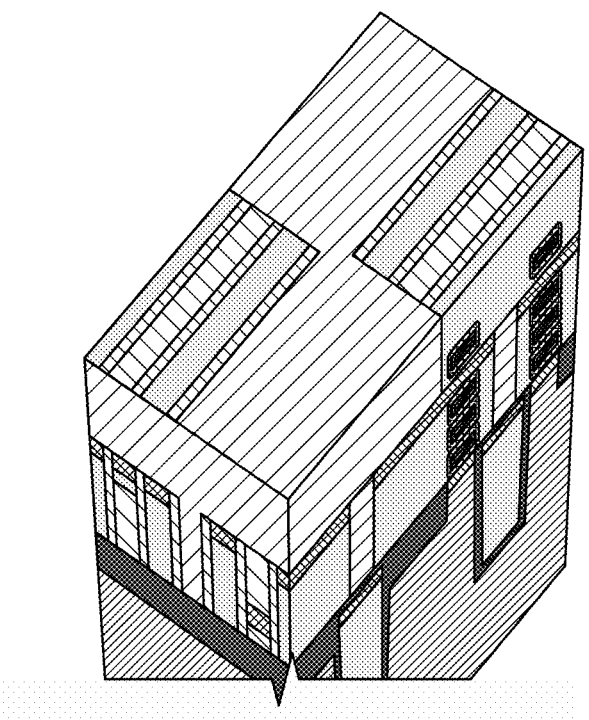

Note that while FIG. 9D shows minimum over etch of the oxide and gate spacer material, it is also possible to expect more over etch, to the point where the local interconnects of the source and drain of the inverter below may be uncovered. There again, the dielectric cap on these interconnects acts as an etch stop layer. This not a problem as well. Because once this CT_SG etch is completed, the structure is filled with oxide again, and then planarized by CMP as illustrated in FIG. 9E.

Figure 10:
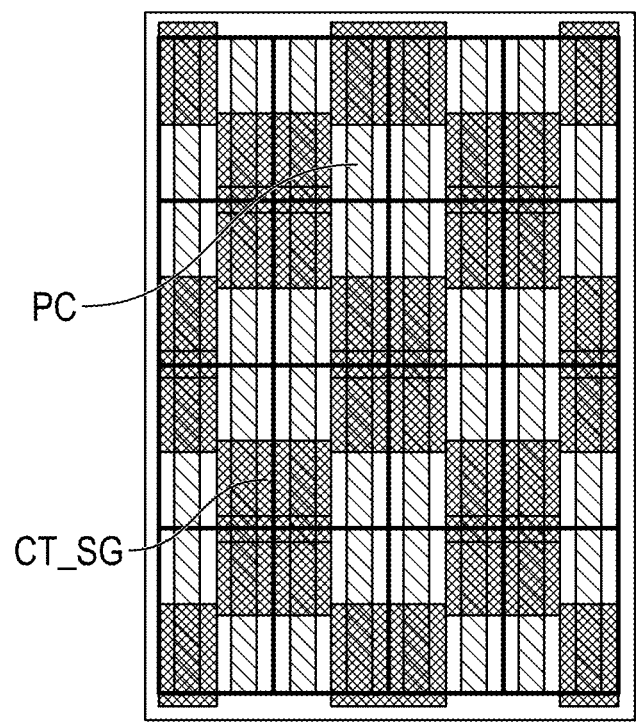
FIG. 10 shows a layout view of an SRAM bit cell array, in accordance with exemplary embodiments of the disclosure.

While the layout view is centered on 1 bit cell, it should be noted again that due to the symmetrical nature of the bit cells organization, d1 and d2 have their symmetrical duplicates in the adjacent cell to the left (as shown by d1N and d2N for ex). Therefore, CT_SG is symmetrical as well, along the cell boundaries. This is partially represented on the layout where CT_SG top shape extends to the left adjacent cells, and CT_SG bottom shape extends to the right adjacent cells. FIG. 10 represents a layout view of an SRAM bit cell array showing how CT_SG is shaped across an array. Each bit cell is represented by a black outline box.

This completes phase 1, the structure is now ready for phase 2 and the actual implementation of the cross-couple. FIGS. 11A-11E resume the flow from FIG. 9E. The layout view is the same but adds the cross-couple layer (XC). XC 1118 is patterned on FIG. 11B. FIG. 11C shows an inside cross-section to better illustrate XC patterning, following the A-B cross-section as shown on the layout view in FIG. 11A. The layout view also points where the different pass-gate devices are located, to better identify orientation. In particular, as described above, the views presented center on a bit cell, but some devices of adjacent cells all around are partially visible. In particular, PG1 1104, INV1 1112, and PG2 1106, INV2 1110 represent the active devices of the bit cell of interest, as presented in FIG. 2, while PG1N 1102

(N=neighbor), PG2N 1108, INV1N 1114 and INV2N 1116 represent the active devices of adjacent neighboring cells when visible. In addition, 1103 is NS, 1105 is CT_SG, and 1107 is PC.

Figure 11A:
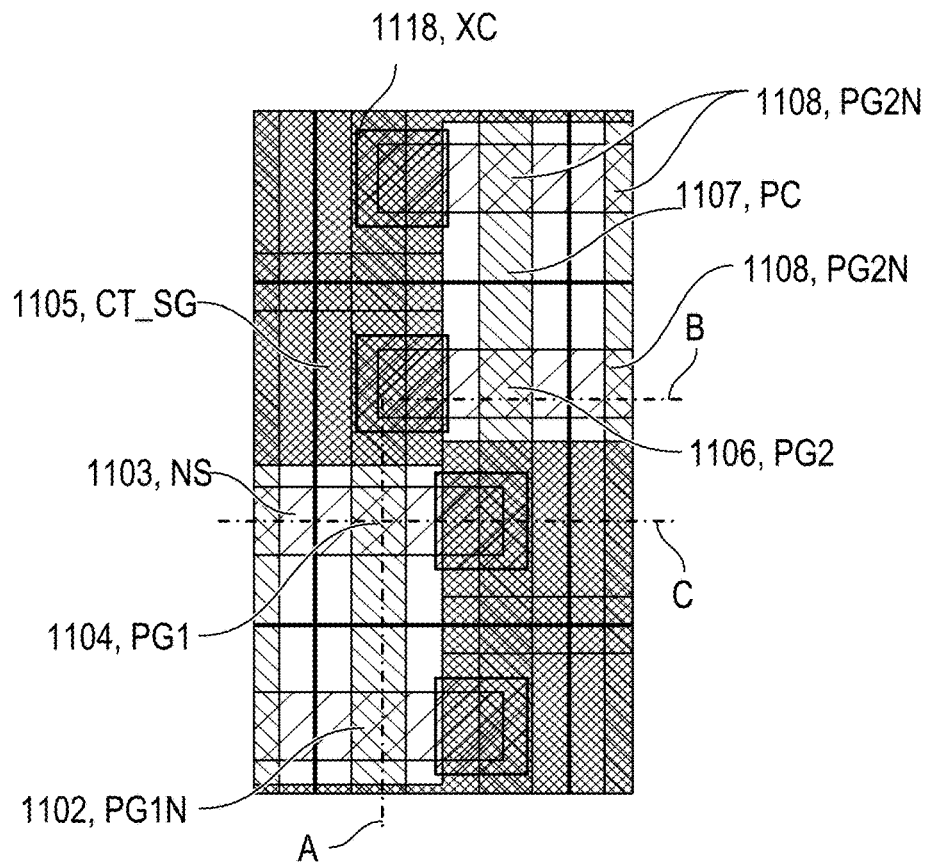
FIGS. 11A-11E show a formation of cross-couple, in accordance with exemplary embodiments of the disclosure.
Figure 11B:
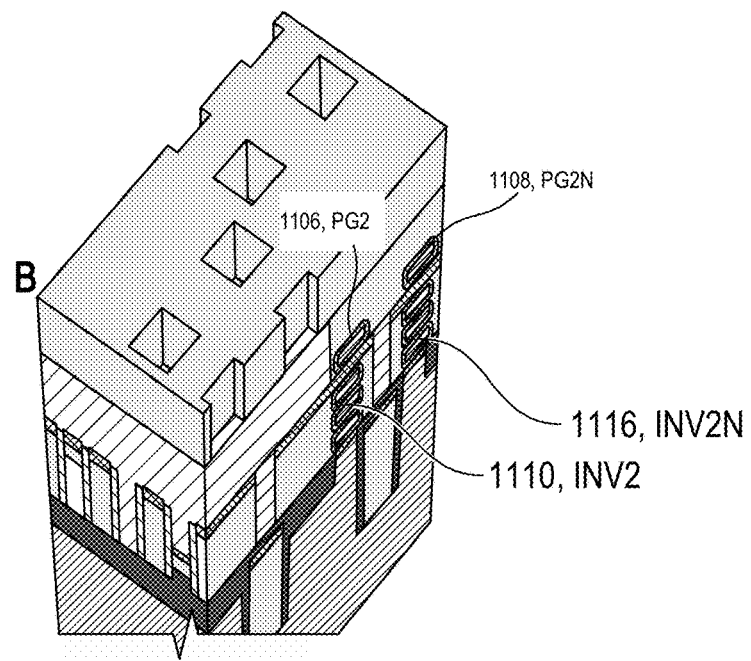
Figure 11C:
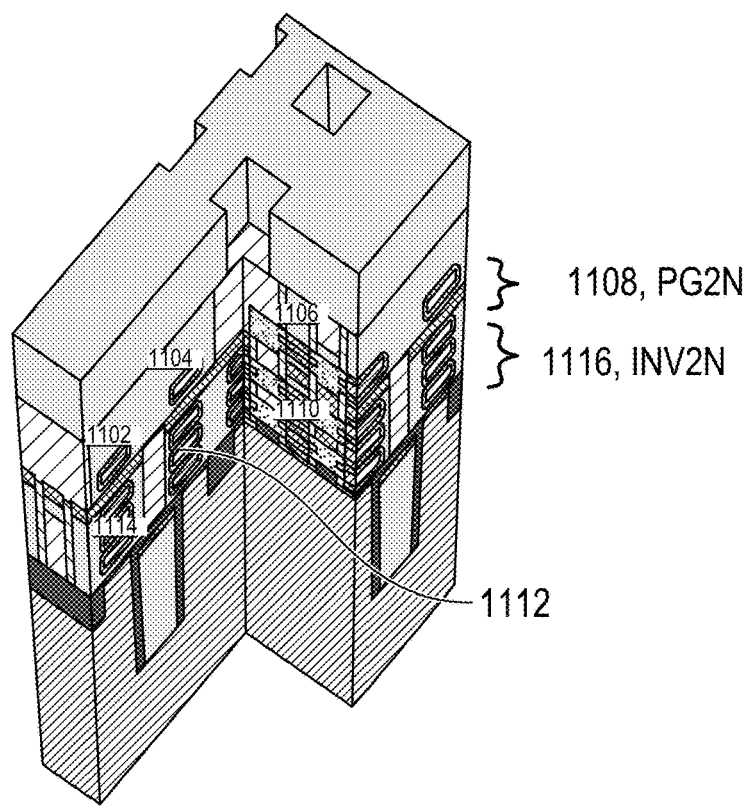
Figure 11D:
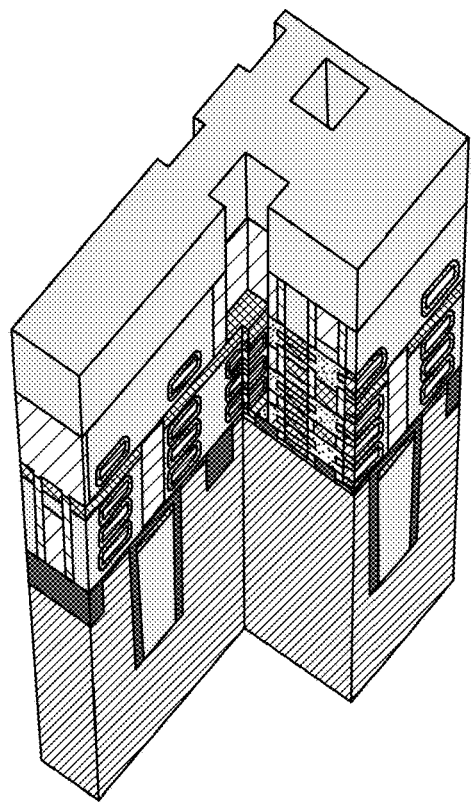
Figure 11E:
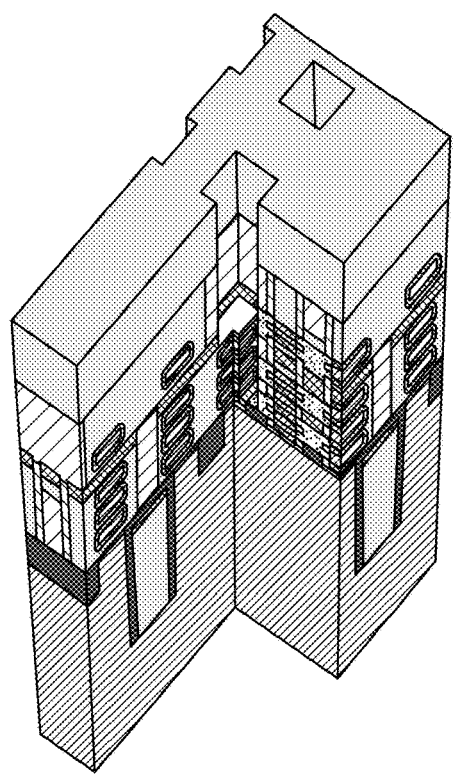

As seen in FIG. 11A, XC 1118 opens access to a portion of the areas cleared by CT_SG. The next step is the XC etch in FIG. 11D. This etch has multiple goals: it must uncover the top of INV1 1112 gate that extends under XC 1118. It must uncover the side of PG2 1106 source (or drain) and the side of INV2 1110 sources (or drains) for both NMOS and PMOS in FIGS. 11D-11E.

FIGS. 12A-12E show the same steps but focused on cross-section B to better illustrate the XC etch. The XC etch can be executed in multiple anisotropic etch sequences. For convenience in describing embodiments, simplified steps are illustrated. First, a dielectric step etches the oxide (SiO2) and gate spacer (SiN, SiON, SiCN, SiOCN etc.).

Figure 12A:
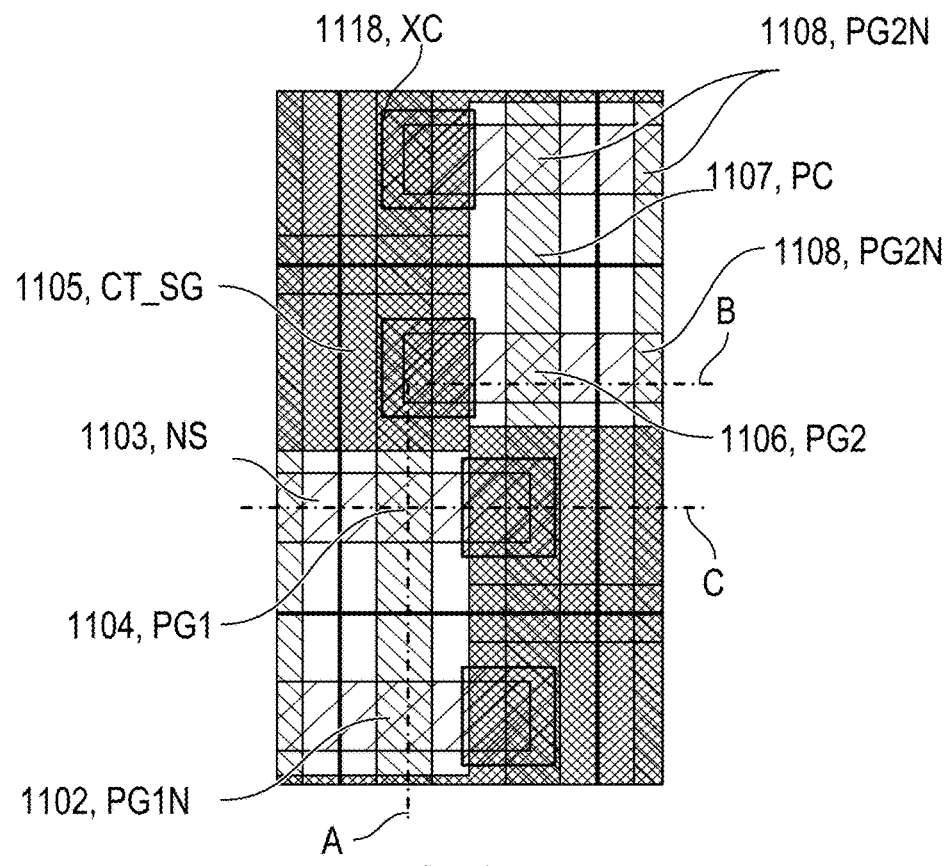
FIGS. 12A-12E show a formation of cross-couple, in accordance with exemplary embodiments of the disclosure.
Figure 12B:
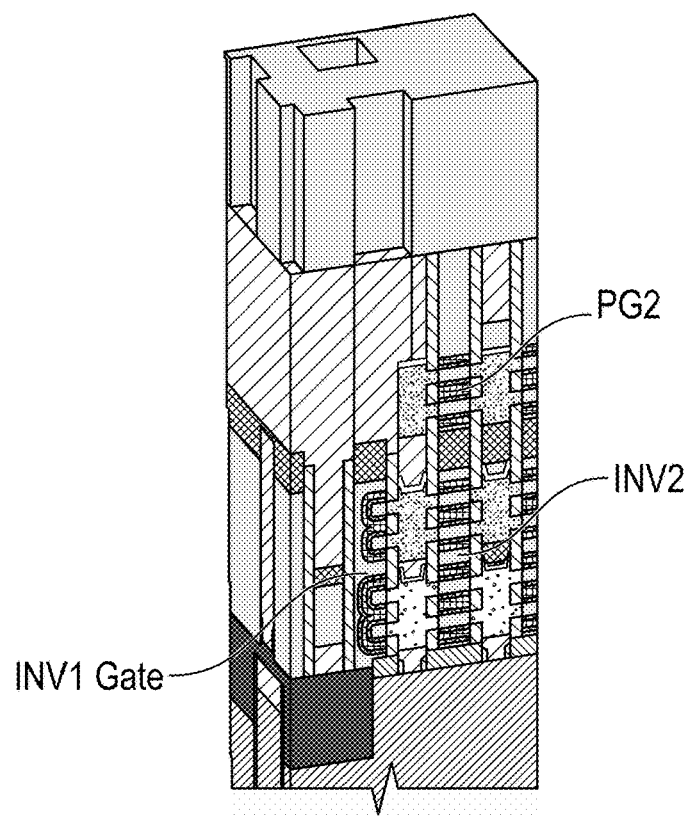
Figure 12C:
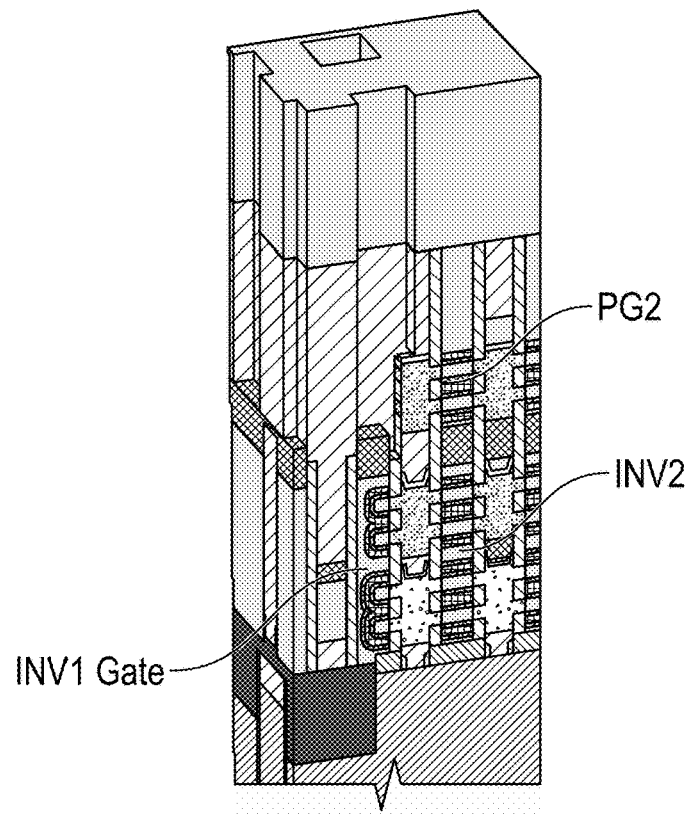
Figure 12D:
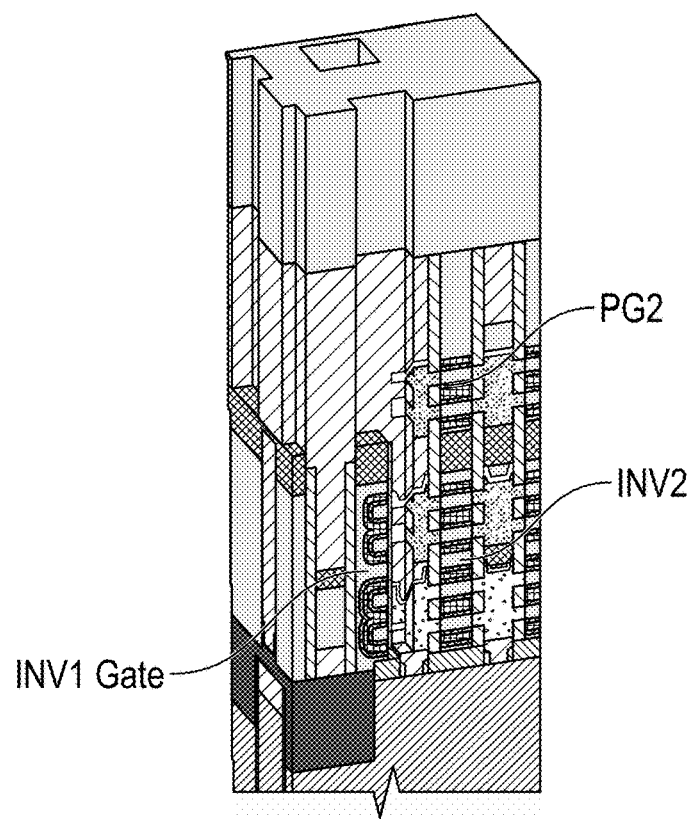
Figure 12E:
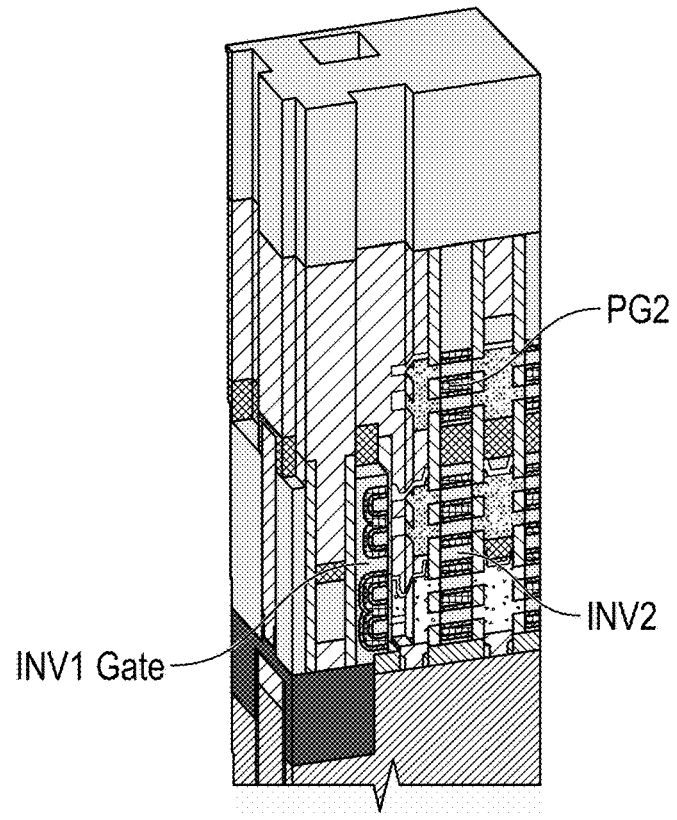

This uncovers the dielectric cap on the inverter gate (INV1) and also the top of a portion of the source (or drain) of PG2. Second, the uncovered portion of the source (or drain) of PG2 is etched and this is extended all the way down to etch a similar portion of the source (or drain) of the NMOS and PMOS of the INV2. As seen in FIG. 12D, the sides of the source (or drain) of PG2 and INV2 are uncovered. Lastly, the dielectric cap is etched to expose the gate of INV1 in FIGS. 11E and 12E.

Figure 13A:
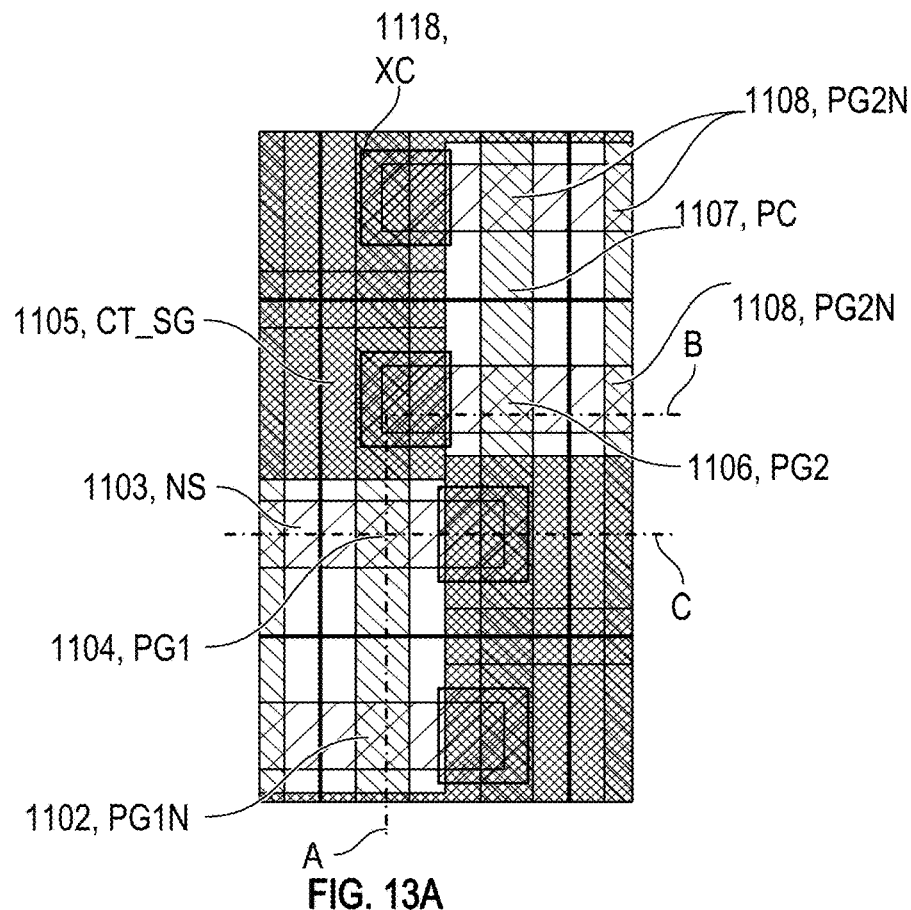
FIGS. 13A-13E show a formation of cross-couple, in accordance with exemplary embodiments of the disclosure.
Figure 13B:
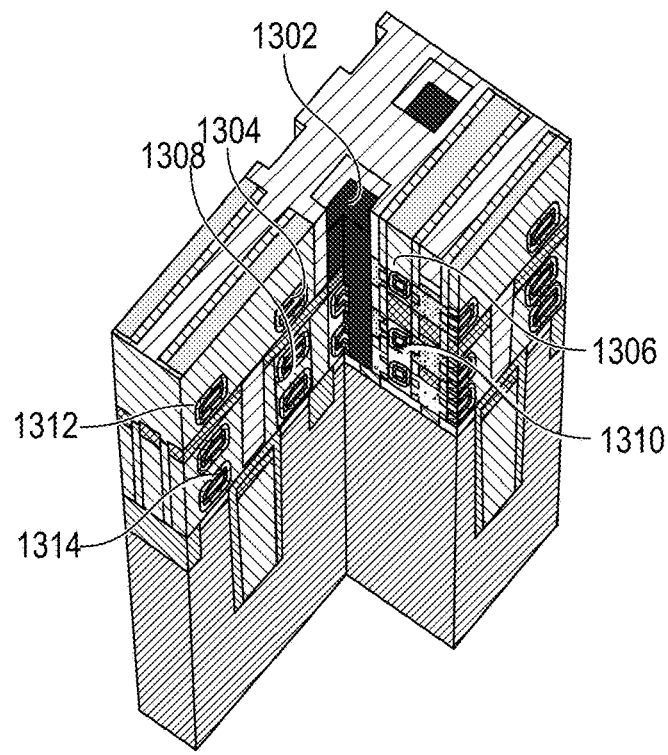
Figure 13C:
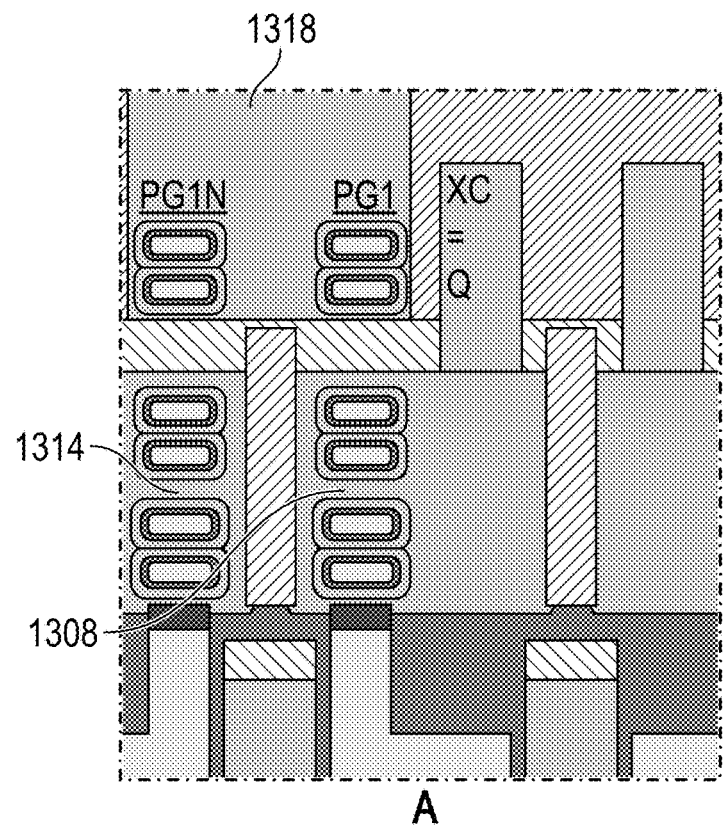
Figure 13D:
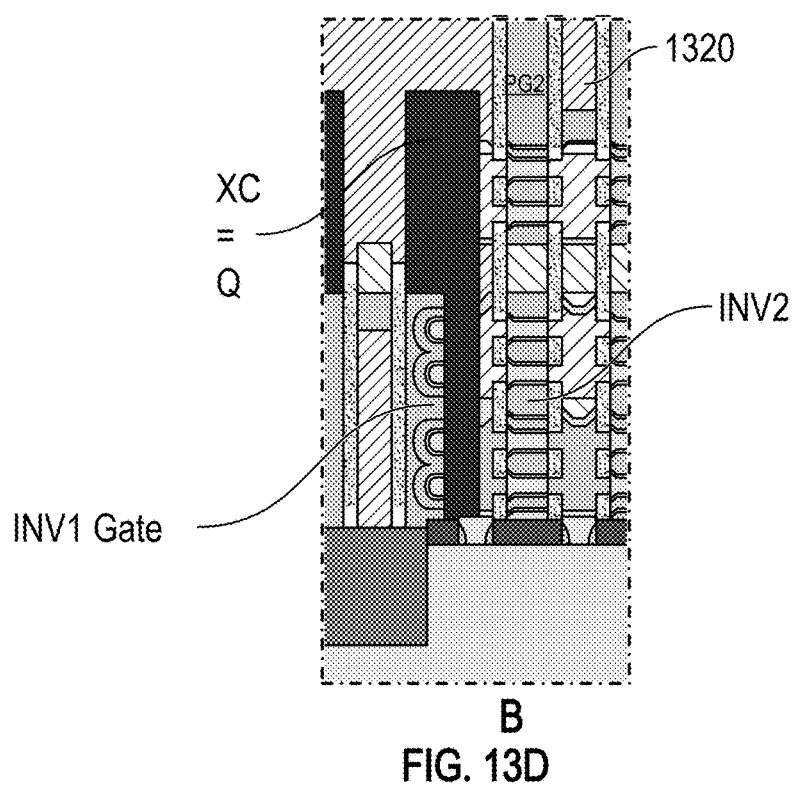
Figure 13E:
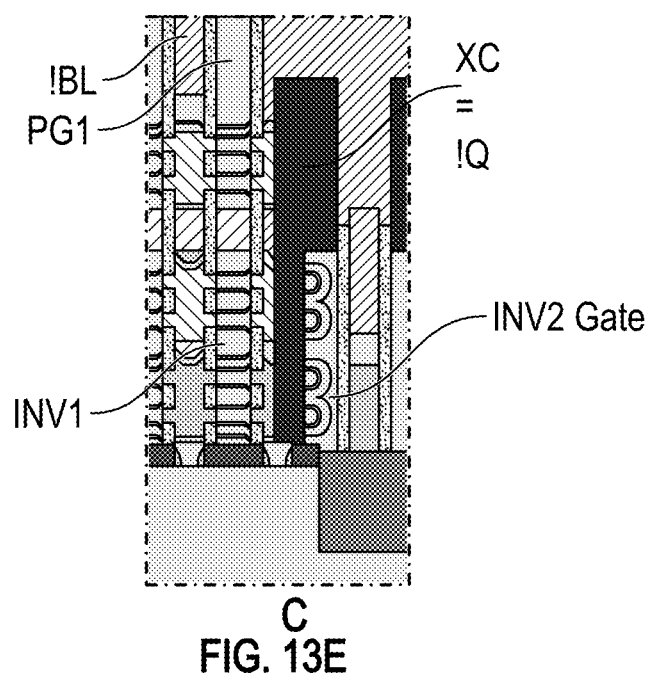
Figure 14A:
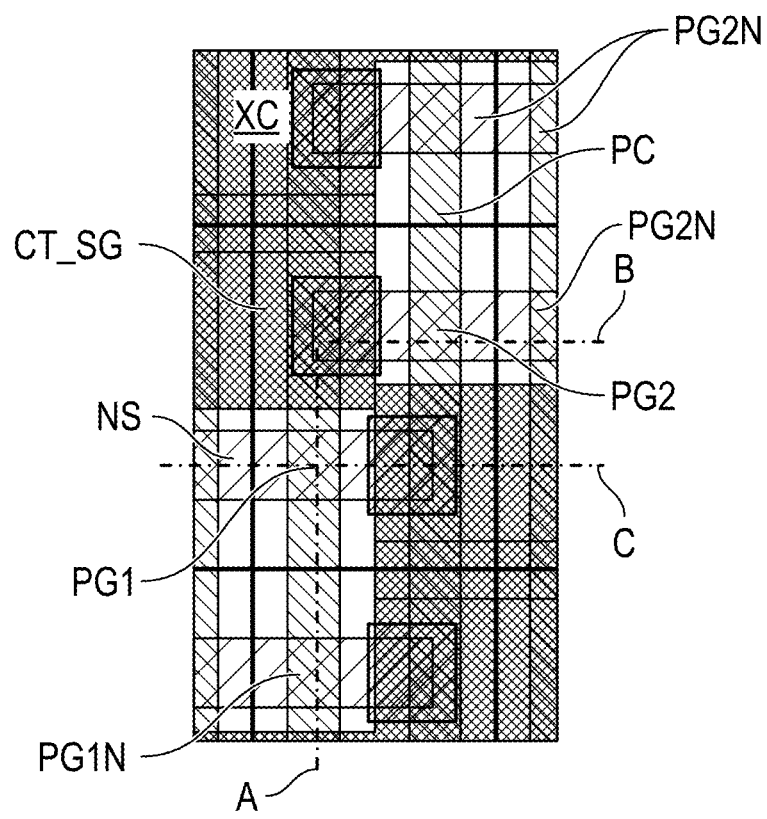
FIGS. 14A-14E show a formation of the cross-couple, in accordance with exemplary embodiments of the disclosure.
Figure 14B:
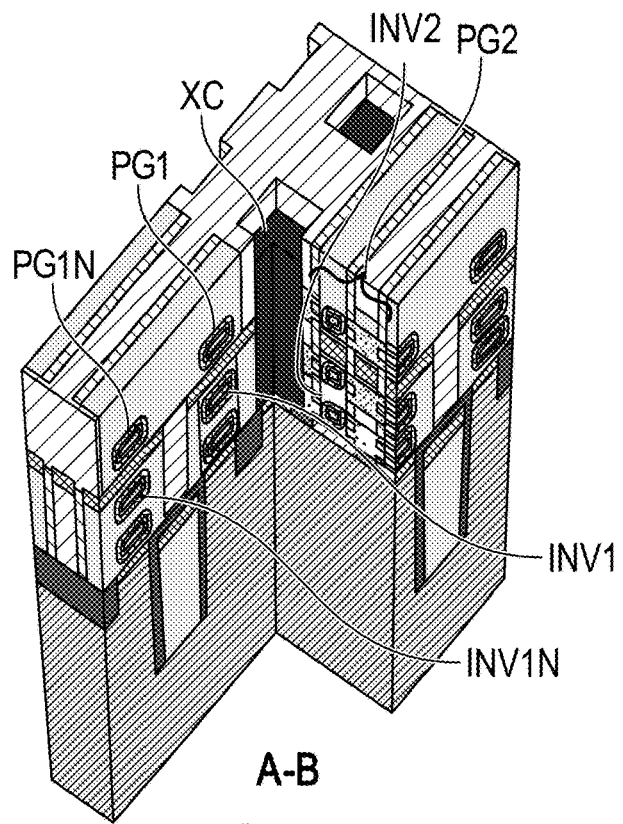
Figure 14C:
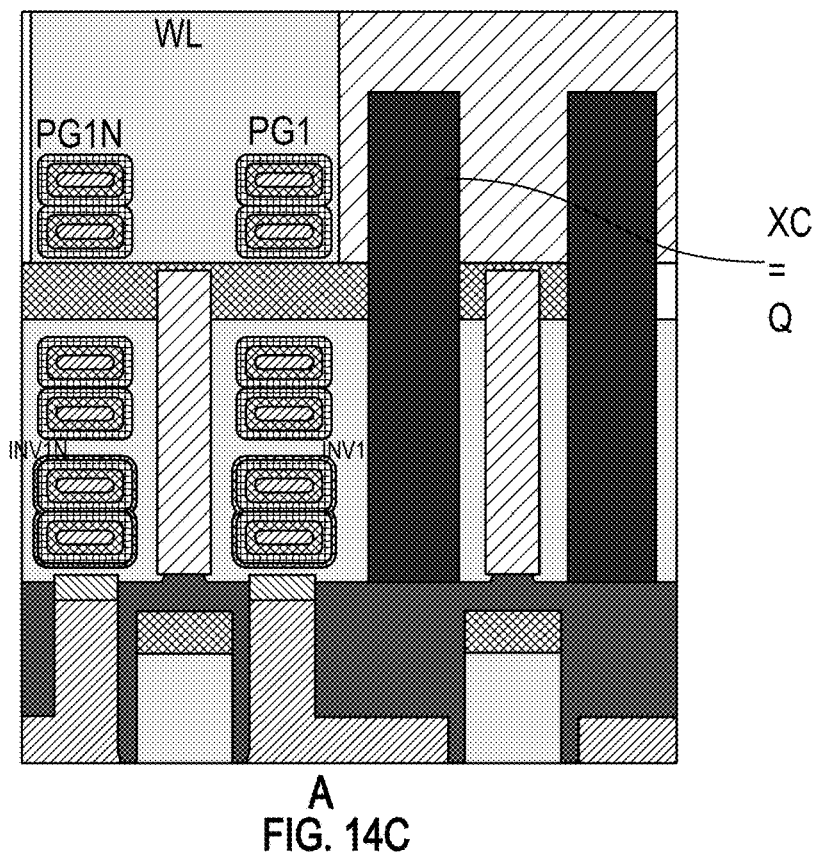
Figure 14D:
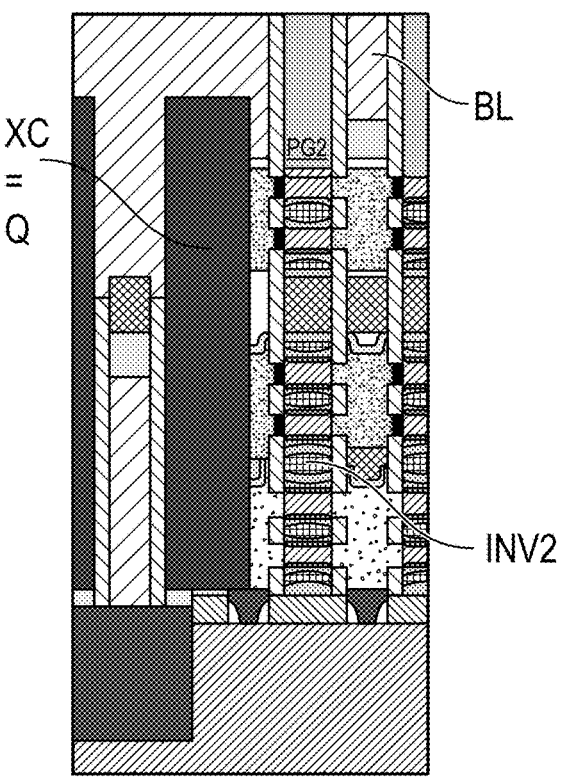
Figure 14E:
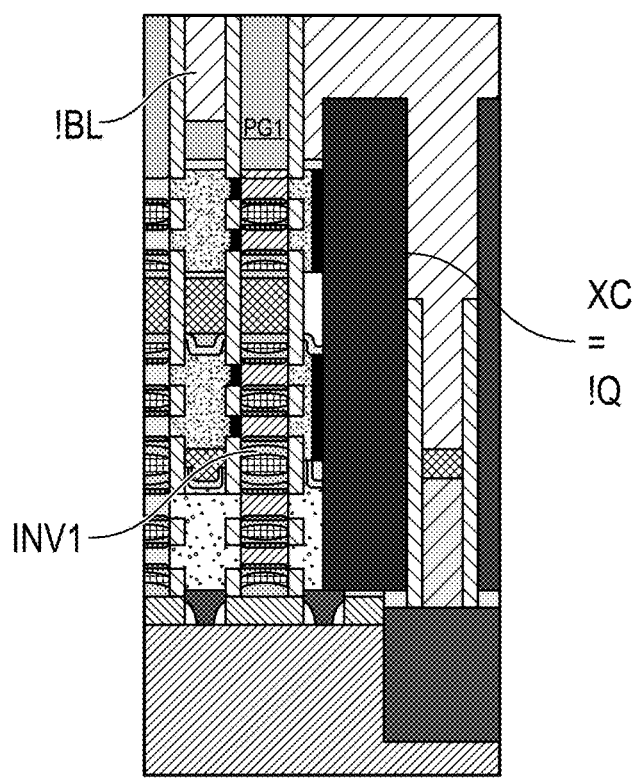

Now that the XC etch is completed, the cavity created is filled by metal (W, Ru, Co, Cu) as shown in FIGS. 13A-13E. As illustrated on the cross-section A-B in FIG. 13B, cross-section A in FIG. 13C, cross-section B in FIG. 13D, and cross-section C in FIG. 13E, when the metal is dropped into the cavity, it connects together the source (or drain) of PG2 1306, the source (or drain) of each device of INV2 1310 and the gate of INV1 1308, therefore effectively forming the cross-couple 1302. Cross-section C in FIG. 13E represents the cross-couple 1302 for the symmetric half of the bit cell. In FIG. 13B, 1304 represents PG1, 1312 represents PG1N, and 1314 represents INV1N. In FIG. 13C, 1317 represents WL. In FIG. 13D, 1320 represents BL.

It should be noted that the section of the gate of INV1 shown in cross-section B can alternatively be completely etched away during the XC etch shown in FIGS. 11A-11E and 12A-12E. The resulting variant of FIGS. 13A-13E is FIGS. 14A-14E.

Figure 15A:
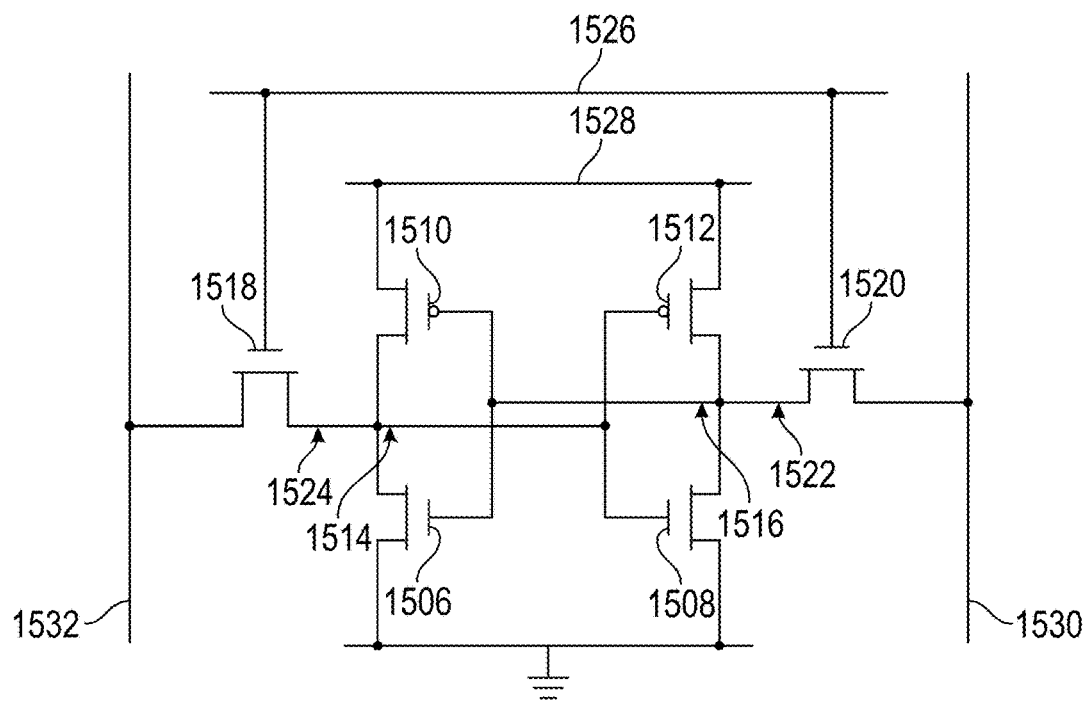
FIGS. 15A-15B show a SRAM bit cell structure, in accordance with exemplary embodiments of the disclosure.
Figure 15B:
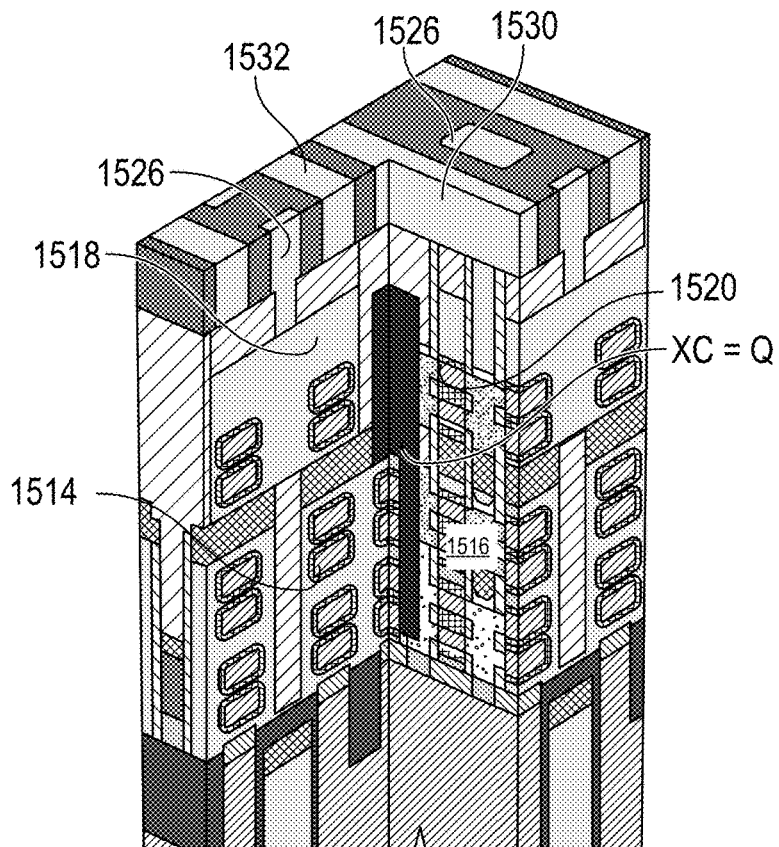

FIG. 15 shows the structure finalized with the first metal level and fully functional SRAM bit cell and array. In FIG. 15A, 1506 represents PD1, 1508 represents PD2, 1510 represents PU1, 1512 represents PU2, 1514 represents INV1, 1516 represents INV2, 1518 represents PG1, 1520 represents PG2, 1522 represents Q, 1524 represents !Q, 1526 represents word line (WL), 1528 represents VDD, 1530 represents BL, and 1532 represents !BL.

Accordingly, this stack of 3 devices allows for tuning of the electrical behavior of the SRAM bit cell.

As briefly mentioned with the introduction of FIG. 3, there are many SRAM bit cell topologies to address different applications. Similar to logic, these applications range from high density to high performance. The bit cell topology hence ranges from the smallest cell achievable by the process to bigger ones. The smallest cell offers maximum density and therefore low cost, but also minimum drive current strength, e.g., lower speed. The bigger cells have lower density, higher cost, but are faster. On the schematics of FIGS. 15A and B, this translates in different drive strength requirements for PU, PD and PG. Therefore, finFET accommodates this need by providing bit cell designs with a varying active fin number for each device. For example, 1 fin for the PMOS device, e.g., PU, but 2 fins for the NMOS devices, e.g., PD and PG, which is abbreviated as a 1-2-2 cell topology, as opposed to 1-1-1, 2-2-2, 1-3-3 etc. In particular, in finFET technology, it is not possible to have a different fin number between the NMOS devices, and that is a lack in design flexibility.

With techniques herein, however, more design flexibility is provided by adjusting the number of active silicon channels or nanosheets (NS) used by each device. For example, 1 NS for PU, 3 for PD and 2 for PG. The NMOS devices are completely separate and therefore can be tuned independently. Any combination leading to a reasonable initial active stack height is possible. This total design flexibility is highly beneficial.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A static random access memory (SRAM), comprising:
a plurality of SRAM bit cells on a substrate, each SRAM bit cell comprising:
at least six transistors including at least two NMOS transistors and at least two PMOS transistors;
each of the at least six transistors being a lateral gate-all-around transistor in that a gate wraps all around a cross section of one or more channels of the transistor;
the at least six transistors positioned in three decks in which a third deck is positioned vertically above a second deck, and the second deck is positioned vertically above a first deck relative to a working surface of the substrate;
a first inverter formed using a first transistor positioned in the first deck and a second transistor positioned in the second deck;
a second inverter formed using a third transistor positioned in the first deck and a fourth transistor positioned in the second deck;
a pass gate located in the third deck;
separation pillars that provide lateral isolation between gates of only devices on the first deck and the second deck such that pass gates of adjacent SRAM bit cells in the third deck can share a common gate.

2. The static random access memory of claim 1, wherein the third deck is electrically isolated from the first deck and the second deck.

3. The static random access memory of claim 1, wherein the at least six transistors are positioned in two vertical stacks in which each stack has at least three transistors positioned over each other.

4. The static random access memory of claim 1, wherein one or more of the at least six transistors includes two or more nano-channels.

5. The static random access memory of claim 1, wherein at least one transistor includes more channels compared to another transistor of a given stack of transistors.

6. The static random access memory of claim 1, wherein an output of the first inverter connects to an input of the second inverter.

7. The static random access memory of claim 1, wherein an output of the second inverter connects to an input of the first inverter.

8. The static random access memory of claim 1, wherein at least one NMOS transistor and at least one PMOS transistor share a common vertical gate.

9. A static random access memory (SRAM), comprising:
a plurality of SRAM bit cells on a substrate, each SRAM bit cell comprising:
at least six transistors including at least two NMOS transistors and at least two PMOS transistors;
each of the six transistors being a lateral gate-all-around transistor in that a gate wraps all around a cross section of one or more channels of the transistor;
the at least six transistors positioned in three decks in which a third deck is positioned vertically above a second deck, and the second deck is positioned vertically above a first deck relative to a working surface of the substrate;
a first inverter formed using a first transistor positioned in the second deck and a second transistor positioned in the third deck;
a second inverter formed using a third transistor positioned in the second deck and a fourth transistor positioned in the third deck;
a pass gate located in the first deck; and
separation pillars that provide lateral isolation between gates of only devices on the second deck and the third deck such that pass gates of adjacent SRAM bit cells in the first deck can share a common gate.

10. The static random access memory of claim 9, wherein one or more of the at least six transistors includes two or more nano-channels.

11. The static random access memory of claim 9, wherein the third deck is electrically isolated from the first deck and the second deck.

12. The static random access memory of claim 9, wherein the at least six transistors are positioned in two vertical stacks in which each stack has at least three transistors positioned over each other.

13. The static random access memory of claim 9, wherein at least one transistor includes more channels compared to another transistor of a given stack of transistors.

14. The static random access memory of claim 9, wherein an output of the first inverter connects to an input of the second inverter.

15. The static random access memory of claim 9, wherein an output of the second inverter connects to an input of the first inverter.

16. The static random access memory of claim 9, wherein at least one NMOS transistor and at least one PMOS transistor share a common vertical gate.

17. A method for forming a static random access memory (SRAM) bit cell on a substrate, the method comprising:
forming at least six transistors including at least two NMOS transistors and at least two PMOS transistors, each of the six transistors being lateral gate-all-around transistors in that a gate wraps all around a cross section of one or more channels of the transistor, the at least six transistors positioned in three decks in which a third deck is positioned vertically above a second deck, and the second deck is positioned vertically above a first deck relative to a working surface of the substrate;
forming a first inverter formed using a first transistor positioned in the second deck and a second transistor positioned in the third deck;
forming a second inverter formed using a third transistor positioned in the second deck and a fourth transistor positioned in the third deck;
forming a pass gate located in the first deck; and
forming separation pillars that provide lateral isolation between gates of only devices on the second deck and the third deck such that pass gates of adjacent SRAM bit cells in the third deck can share a common gate.

18. The method of claim 16, wherein at least one NMOS transistor and at least one PMOS transistor share a common vertical gate.

* * * * *